US009159558B2

(12) United States Patent
Cheng et al.

(10) Patent No.: US 9,159,558 B2
(45) Date of Patent: Oct. 13, 2015

(54) METHODS OF REDUCING DEFECTS IN DIRECTED SELF-ASSEMBLED STRUCTURES

(71) Applicant: INTERNATIONAL BUSINESS MACHINES CORPORATION, Armonk, NY (US)

(72) Inventors: Joy Cheng, San Jose, CA (US); Daniel P. Sanders, San Jose, CA (US); Melia Tjio, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 13/840,880

(22) Filed: Mar. 15, 2013

(65) Prior Publication Data

US 2014/0273476 A1 Sep. 18, 2014

(51) Int. Cl.
 *B05D 1/38* (2006.01)
 *B05D 1/32* (2006.01)
 *B05D 3/10* (2006.01)
 *H01L 21/027* (2006.01)
 *H01L 21/033* (2006.01)
 *H01L 21/3105* (2006.01)
 *B81C 1/00* (2006.01)

(52) U.S. Cl.
 CPC .............. *H01L 21/0273* (2013.01); *B05D 1/32* (2013.01); *B05D 1/38* (2013.01); *B05D 3/107* (2013.01); *B81C 1/00031* (2013.01); *H01L 21/0337* (2013.01); *H01L 21/31058* (2013.01); *B81C 2201/0149* (2013.01)

(58) Field of Classification Search
 CPC ............ B05D 3/00; B05D 3/10; B05D 3/105; B05D 3/107; B05D 1/32; B05D 1/38
 See application file for complete search history.

(56) References Cited

U.S. PATENT DOCUMENTS

| 7,445,671 | B2 | 11/2008 | Sunkara et al. |
| 7,713,753 | B2 | 5/2010 | Xiao et al. |
| 8,059,350 | B2 | 11/2011 | Albrecht et al. |
| 8,083,953 | B2 | 12/2011 | Millward et al. |
| 2002/0065366 | A1 | 5/2002 | Wirnsberger et al. |
| 2004/0116312 | A1* | 6/2004 | Schlicht et al. ............... 510/175 |
| 2008/0217292 | A1* | 9/2008 | Millward et al. ............... 216/46 |
| 2008/0241969 | A1* | 10/2008 | Winkler et al. .................. 438/5 |
| 2011/0039061 | A1 | 2/2011 | Fedynyshyn et al. |

(Continued)

OTHER PUBLICATIONS

P. Mansky et al., "Controlling Polymer-Surface Interactions with Random Copolymer Brushes," Science, vol. 275, pp. 1458-1460, Mar. 1997.

(Continued)

*Primary Examiner* — James M Mellott
(74) *Attorney, Agent, or Firm* — Daniel E. Johnson

(57) ABSTRACT

Methods are disclosed for reducing the number of defects in a directed self-assembled structure formed on a guiding pre-pattern (e.g., a chemical pre-pattern) on a substrate. A first layer comprising a first self-assembly material is applied onto the guiding pre-pattern, with the first self-assembly material forming domains whose alignment and orientation are directed by the guiding pre-pattern; as a result, a first self-assembled structure is formed. The first self-assembled structure is washed away, and a second layer comprising a second self-assembly material is then applied. The second self-assembly material forms a second self-assembled structure having fewer defects than the first self-assembled structure.

34 Claims, 9 Drawing Sheets

(56) References Cited

U.S. PATENT DOCUMENTS

2011/0147983 A1* 6/2011 Cheng et al. ............... 264/220
2011/0209106 A1 8/2011 Cheng et al.

OTHER PUBLICATIONS

Du Yeol Ryu et al., "A Generalized Approach to the Modification of Solid Surfaces," Science, vol. 308, pp. 236-240, Apr. 2005.
Eungnak Han et al., "Photopatternable Imaging Layers for Controlling Block Copolymer Microdomain Orientation," Adv. Mater., vol. 19, pp. 4448-4452, 2007.
Joona Bang et al., "Facile Routes to Patterned Surface Neutralization Layers for Block Copolymer Lithography," Adv. Mater., vol. 19, pp. 4552-4557, 2007.
Shengxiang Ji et al., "Molecular Transfer Printing Using Block Copolymers," ACS Nano, vol. 4, No. 2, pp. 599-609, 2010.
Chi-Chun Liu et al., "Fabrication of Lithographically Defined Chemically Patterned Polymer Brushes and Mats," Macromolecules, vol. 44, pp. A-J, Feb. 2011.
Chris Bencher et al., "Directed Self-Assembly Defectivity Assessment (Part II)," Proc. of SPIE, vol. 8323, pp. 83230N-1-10, 2012.
Christopher M. Bates et al., "Polarity-Switching Top Coats Enable Orientation of Sub-10-nm Block Copolymer Domains," Science, vol. 338, pp. 775-779, Nov. 2012.
Chi-Chun Liu et. al., "Chemical Patterns for Directed Self-Assembly of Lamellae-Forming Block Copolymers with Density Multiplication of Features," Macromolecules, vol. 46, pp. 1415-1424, 2013.
Chris Bencher et al., "Self-Assembly Patterning for sub-15nm Half-Pitch: A Transition from Lab to Fab," Proc. of SPIE, vol. 7970, pp. 79700E-1-9, 2011.
Paulina A. Rincon Delgadillo et al., "Process sensitivities in exemplary chemo-expitaxy directed self-assembly integration," Proc. of SPIE, vol. 8680, 86801H-1-7, Feb. 2013.
Joy Y. Cheng et. al., "Dense Self-Assembly on Sparse Chemical Patterns: Rectifying and Multiplying Lithographic Patterns Using Block Copolymers," Adv. Mater., vol. 20, pp. 3155-3158, 2008.
Joy Y. Cheng et. al., "Simple and Versatile Methods to Integrate Directed Self-Assembly with Optical Lithography Using a Polarity-Switched Photoresist," ACS Nano, vol. 4, No. 8, pp. 4815-4823, 2010.
Erik W. Edwards et al., "Precise Control over Molecular Dimensions of Block-Copolymer Domains Using the Interfacial Energy of Chemically Nanopatterned Substrates," Adv. Mater., vol. 16, No. 15, pp. 1315-1319, Aug. 2004.

* cited by examiner

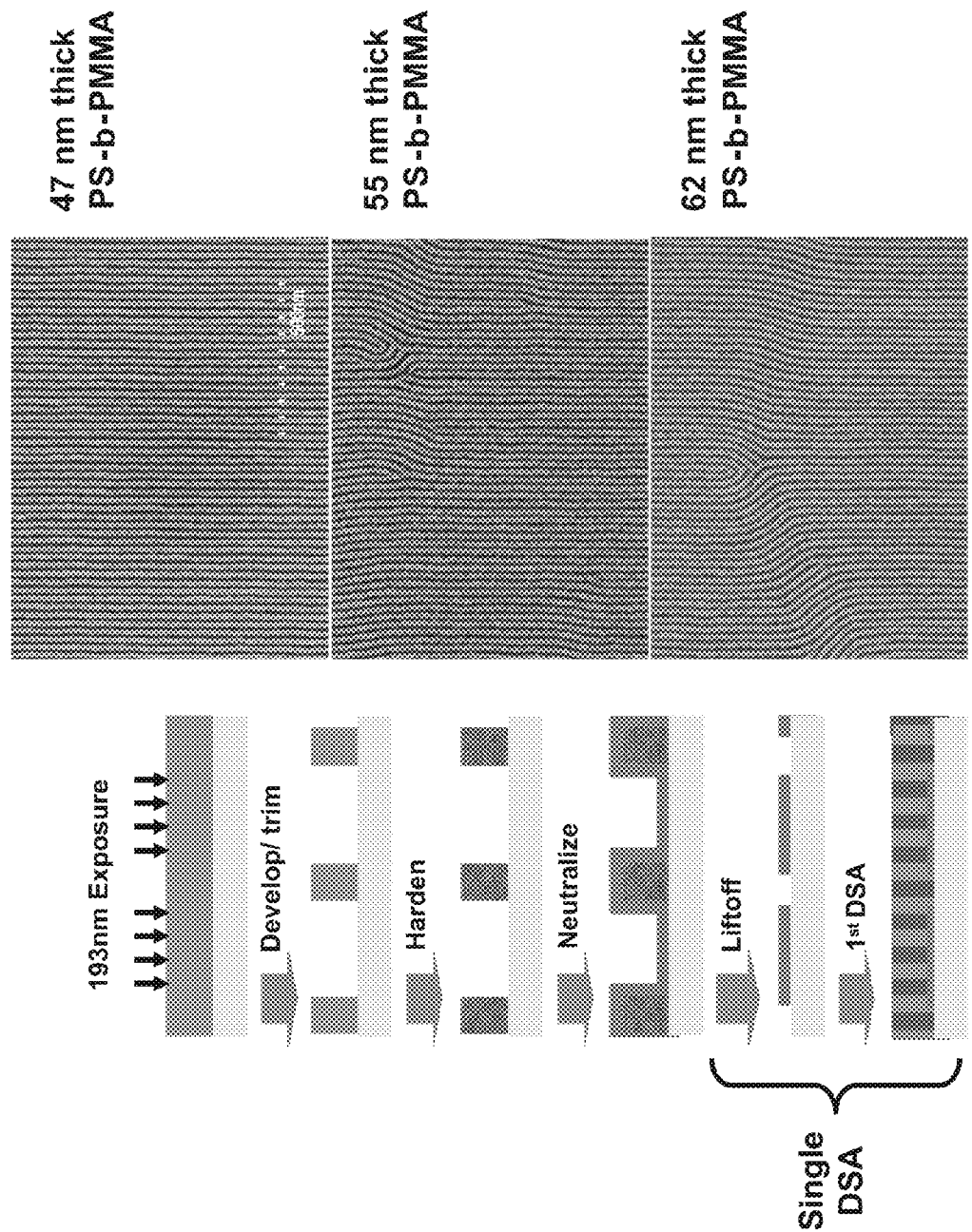

METHODS OF REDUCING DEFECTS IN DIRECTED SELF-ASSEMBLED STRUCTURES

BACKGROUND

The invention relates to methods of directed self-assembly and the layered structures formed therefrom, and more specifically, to the directed self-assembly of microdomains of block copolymers to produce self-assembled structures with fewer defects.

The ability to pattern features with smaller critical dimensions allows denser circuitry to be fabricated, thereby enabling more circuit elements within the same area and reducing the overall cost per element. Features having smaller critical dimensions and tighter pitch are needed in each technology generation. Directed self-assembly (DSA) of polymeric material is a potential candidate to extend current lithography by enhancing the spatial resolution and/or controlling the critical dimension variation of a predefined pattern on a substrate. In addition, the block copolymer (BCP) self-assembly process can improve the dimensional control due to the lower critical dimension variation (both mean critical dimension and line-edge roughness (LER) or line-width roughness (LWR)) in the final self-assembled structure compared to that in the pre-pattern. In particular, DSA of block copolymer (BCP) materials and polymer blends have been explored for this purpose.

In the graphoepitaxy method, the self-organization of block copolymers is guided by topographical features of pre-patterned substrates. With a trench of width L and BCP with a periodicity of $P_{BCP}$, frequency multiplication of a factor of $L/P_{BCP}$ can be achieved. In practice, it is useful for the bottom of the trench to be comprised of an orientation control material in order to support perpendicularly-oriented domains.

Alternatively, in early forms of the chemical epitaxy method, the self-assembly of BCP materials to form domains is directed by dense chemical patterns. The pitch of the chemical pattern ($P_S$) is roughly equivalent to the pitch of the BCP domain periodicity ($P_{BCP}$). The preferential affinity between at least one of the chemical pattern regions and a corresponding BCP domain directs the self-assembly of the BCP domains in accordance with the underlying chemical pre-pattern. Unfortunately, current optical lithography tools do not have sufficient resolution to print these 1:1 chemical patterns. Instead, these patterns have been fabricated using lithographic techniques such as e-beam direct write or extreme-ultraviolet (EUV, 13.5 nm) interference lithography, which are not suitable for volume manufacturing.

Alternatively, chemical epitaxy on sparse chemical patterns can provide critical dimension and orientation control similar to that achieved on dense chemical patterns while also providing enhanced resolution. For example, the directed self-assembly of BCP material can form domains on a sparse chemical pattern layer comprised of alternating pinning regions having a width $W_P=0.5*P_{BCP}$ and regions with an orientation control material having a width $W_{CA}=P_S-W_P$. An orientation control material having an operationally equivalent affinity for both domains is used to support perpendicularly-oriented domains. The factor of frequency multiplication is determined by the ratio of the pitch of the sparse chemical patterns stripe ($P_S$) and the pitch of BCP ($P_{BCP}$). A ratio of $P_S/P_{BCP}=2$ would result in frequency doubling and a ratio of $P_S/P_{BCP}=3$ would result in frequency tripling. In practice, it has been shown that the defect levels observed in the DSA of block copolymers via chemical epitaxy on sparse chemical patterns increase with the factor of frequency multiplication.

SUMMARY

Methods are described herein in which the directed self-assembly of block copolymer materials leads to lower levels of defects, especially when using thicker films of block copolymers, compared to prior art techniques.

One aspect of the invention is a method of reducing the number of defects in a directed self-assembled structure formed on a guiding pre-pattern (e.g., a chemical pre-pattern) on a substrate. The method includes applying a first layer comprising a first self-assembly material onto the guiding pre-pattern, with the first self-assembly material forming domains whose alignment and orientation are directed by the guiding pre-pattern; as a result, a first self-assembled structure is formed. The method further includes washing away the first self-assembled structure. After this washing step, a second layer comprising a second self-assembly material is applied over the substrate. This second layer occupies space previously occupied by the first layer (which has now been washed away). The second self-assembly material forms a second self-assembled structure having fewer defects than the first self-assembled structure. For example, the second self-assembled structure may advantageously have fewer dislocation defects than the first self-assembled structure; the second self-assembled structure may advantageously have a dislocation defect density that is less than or equal to about 25 per square centimeter.

The method preferably includes annealing the first layer, prior to the washing step. Also, the method may include, after the step of washing but before the step of applying the second layer, baking the substrate to remove any residual solvent. The method preferably also includes annealing the second layer. The method may also include etching the second self-assembled structure once it has been formed. However, the method preferably includes no etch process between (i) the step of applying the first layer and (ii) the step of applying the second layer.

In one implementation of the method, the first self-assembly material and the second self-assembly material are the same kind of material, such as PS-b-PMMA. The thickness of the first layer is preferably less than the thickness of the second layer. The thickness of the second layer is preferably at least about 55 nm and preferably greater than two times that of a characteristic pitch of the second self-assembled structure. Furthermore, the second self-assembled structure may have a pitch that is less than 50 nm, or even less than or equal to about 25 nm. The method may be advantageously incorporated into an in-line process, such as a 300 mm wafer process.

The method may be extended to additional washing and layer application steps. In one implementation, for example, the second self-assembled structure is washed away; thereafter, a third layer that includes a third self-assembly material is formed over the substrate, with the third layer occupying space previously occupied by the first layer. In this case, the third self-assembly material forms a third self-assembled structure having fewer defects than the second self-assembled structure.

Another aspect of the invention is a method of reducing the number of defects in a directed self-assembled structure formed on a guiding pre-pattern (e.g., a chemical pre-pattern) on a substrate. This method includes applying a first layer comprising a first self-assembly material onto the guiding pre-pattern, with the first self-assembly material forming domains whose alignment and orientation are directed by the guiding pre-pattern, thereby creating a first self-assembled structure. This method further includes washing away the first self-assembled structure and leaving behind a modified guiding pre-pattern. After the washing step, a second layer comprising a second self-assembly material is applied onto the modified guiding pre-pattern. The second self-assembly material forms a second self-assembled structure having fewer defects than the first self-assembled structure. For example, the second self-assembled structure may advantageously have fewer dislocation defects than the first self-assembled structure; the second self-assembled structure may advantageously have a dislocation defect density that is less than or equal to about 25 per square centimeter.

In this method, the first layer is annealed, prior to the washing step, and the second layer is also annealed. The thickness of the first layer is preferably less than the thickness of the second layer. Also, this method may be advantageously incorporated into an in-line process, such as a 300 mm wafer process. Preferably no etch process is performed between (i) the step of applying the first layer and (ii) the step of applying the second layer. However, the second self-assembled structure is preferably etched.

BRIEF DESCRIPTION OF THE SEVERAL VIEWS OF THE DRAWINGS

In the drawings, like elements are numbered alike.

FIGS. 2H-2J are schematic layer diagrams showing the inventive double DSA method used to produce a self-assembled structure having a reduced number of defects.

FIG. 4A shows the process flow for a single DSA process.

FIG. 4B shows SEM images of first directed self-assembled structures of three different film thicknesses formed by the single DSA process of FIG. 4A. The PMMA domains have been removed by an O2 RIE process to provide contrast for visualization.

DETAILED DESCRIPTION

Figure 1A:
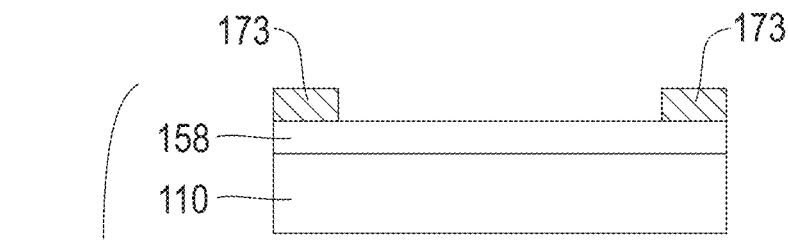
FIGS. 1A-1C are schematic layer diagrams showing the inventive double DSA method to produce a self-assembled structure having a reduced number of defects.
Figure 1B:
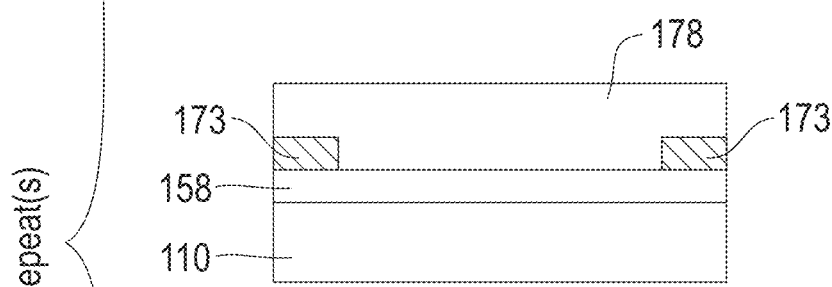

The methods described herein utilize a double DSA process to afford self-assembled structures with a reduced number of defects.

A "pre-pattern" is a specific term used herein referring to the collection of surfaces contacted by the casting solution of the self-assembly (SA) material. One or more of the surfaces directs self-assembly. The SA material, after removal of the casting solvent, can be disposed on all or some of these surfaces.

A "graphoepitaxial pre-pattern" is a pre-pattern in which topography and surface properties influence self-assembly. A "chemical pre-pattern" is a pre-pattern in which self-assembly is predominantly influenced by surface properties. No sharp dimensional limits exist between these two pre-pattern categories because the extent of topographical influence on self-assembly is also dependent on the thickness of the SA layer in relation to the underlying relief surface. In general, however, when graphoepitaxial pre-patterns are used, the thickness of the SA layer is less than or equal to the trench height of the underlying pre-pattern. For chemical pre-patterns, the SA thickness is greater than any trench height of the underlying topography.

As indicated above, a material capable of self-assembling into compositionally different, phase-separated domains is referred to as an SA material. The term "substrate" refers to all layers underlying a structure on which the SA material layer is disposed, or if an orientation control layer is used, any layer or layers underneath the orientation control layer. The substrate can have one or more layers arranged in a stack. As non-limiting examples, the substrate can include a silicon wafer, a metal foil, a hard mask, a dielectric layer, and/or an anti-reflection layer (ARC). The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and thickness. The term "casting" refers to forming a layer of a material by disposing on another layer a solution of the material dissolved in a solvent, and removing the solvent. Unless otherwise stated, copolymers are random copolymers, indicated by "-co-", or "-r-" in the name. Block copolymers are indicated by "-b-" or "-block-" in the name. Alternating block copolymers are indicated by "-alt-" in the name.

Casting a solution of orientation control material, or a solution of SA material, is understood to mean that the solution makes contact with all the available surfaces of the layer (i.e., surfaces in contact with the surrounding atmosphere). These can include substrate surfaces, photoresist surfaces, and orientation control material surfaces. When referring to the chemical components, reactivity, solubility and/or surface properties of the initial layer or the treated layer, it is understood that such reference is directed only to the photoresist material and not to the substrate, the substrate surface, or an orientation control material surface, unless otherwise stated. Likewise, when referring to the chemical components, chemical reactivity, solubility and/or surface properties of the substrate surface or a substrate layer, such reference is directed only to the substrate surface or the substrate layer and not to the photoresist material or orientation control material unless otherwise stated. Further, when referring to the chemical components, chemical reactivity, solubility and/or surface properties of the orientation control material or orientation control layer, such reference is directed only to the orientation control material or orientation control layer and not to the photoresist material or substrate material, unless otherwise stated.

One embodiment of the disclosed method is illustrated in the schematic layer diagrams of FIGS. 1A to 1D. Fabrication of the pre-pattern (see FIG. 1A) is described in Cheng et al. *Adv. Mater.* 2008, 20, 3155-58 and U.S. Pat. Nos. 7,521,094 and 8,226,838, which are hereby incorporated by reference. As shown in FIG. 1A, a substrate 110 underlies an orientation control layer 158. Photoresist material is applied over the orientation control layer 158, exposed, and developed, thereby resulting in regions 173 of exposed photoresist. Together, the regions 173 of the exposed photoresist and the uncovered regions of the orientation control layer 158 constitute the chemical pre-pattern that will be used in the DSA process.

Figure 1C:
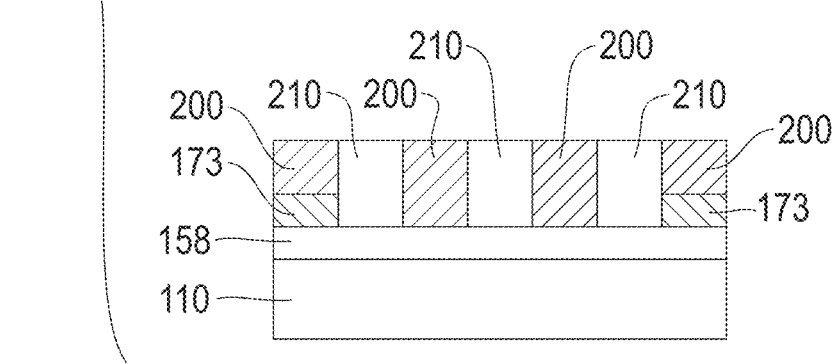

A solution is prepared comprising one or more SA materials dissolved in a solvent. The solution is cast onto the structure shown in FIG. 1A, followed by removal of the solvent, thereby forming the first SA layer 178 (see FIG. 1B). The solution of SA material can additionally comprise other materials including polymers, block copolymers, surfactants, photoacid generators, and thermal acid generators. For example, an organosilicate resin can be included that is miscible with the poly(ethylene oxide) domains of poly(ethylene oxide-block-styrene) copolymer. In the first DSA step, the SA material is allowed to phase separate and the resulting domains 200, 210 align as directed by the underlying chemical pre-pattern to form a first self-assembled structure (FIG. 1C). Phase separation and alignment can occur during film formation, during a post-application bake, or during a subsequent annealing process. Suitable annealing processes include thermal annealing, thermal gradient annealing, solvent vapor annealing or annealing by other gradient fields. The first self-assembled structure comprises a first domain 200 and a second domain 210 of SA material. The first and second domains 200 and 210 comprise different components of the SA material; that is, they are compositionally different. The first domain 200 can, for example, comprise one block of a block copolymer, and the second domain 210 can comprise a different block of a block copolymer.

After the first DSA step, all or substantially all the first self-assembled structure is removed from the substrate using at least one solvent. In one embodiment, all or substantially all the first self-assembled structure is removed from the substrate by applying a layer of solvent on top of the first self-assembled structure and spinning the wafer dry. The application of a layer of solvent may be accomplished by any method known in the art, including puddling, spraying, and/or dipping. During the removal process, dynamic wafer agitation by controlled rotation or sonication may be employed to facilitate the removal of the first self-assembled structure. In another embodiment, a combination of solvents is used. In yet another embodiment, a combination of solvents is used in a sequential manner. In yet another embodiment, the wafer (substrate) is baked after the removal process to drive off any remaining solvent.

After the first self-assembled structure has been removed, what remains is a structure similar to that shown in FIG. 1A, but one that includes (it is believed, without wishing to be bound by theory) a chemical pre-pattern that has been slightly modified with respect to the original chemical pre-pattern. A second self-assembled structure is then constructed, using the techniques described above in connection with forming the first self-assembled structure. Specifically, a (second) solution is prepared comprising one or more SA materials dissolved in a solvent. The solution is cast onto the modified, chemically patterned surface (analogous to that shown in FIG. 1A), followed by removal of the solvent, thereby forming a second SA layer (analogous to that shown in FIG. 1B). The solution of SA material can additionally comprise other materials including polymers, block copolymers, surfactants, photoacid generators, and thermal acid generators. For example, an organosilicate resin can be included that is miscible with the poly(ethylene oxide) domains of poly(ethylene oxide-block-styrene) copolymer. SA material is allowed to phase separate and the resulting domains align as directed by the underlying modified, chemical pre-pattern to form a second self-assembled structure (analogous to that shown in FIG. 1C, but enjoying fewer defects, as described below). Phase separation and alignment can occur during film formation, during a post-application bake, or during a subsequent annealing process. Suitable annealing processes include thermal annealing, thermal gradient annealing, solvent vapor annealing or annealing by other gradient fields. As with the first self-assembled structure, the second self-assembled structure comprises a first domain and a second domain of SA material. The first and the second domains comprise different components of SA material; that is, they are compositionally different. The first domain can, for example, comprise one block of a block copolymer, and the second domain can comprise a different block of a block copolymer.

In one embodiment, the thickness of the second self-assembled structure is greater than the thickness of the first self-assembled structure. In another embodiment the thickness of the second self-assembled structure is greater than 55 nm. In another embodiment the thickness of the second self-assembled structure is greater than twice that of the characteristic pitch of the SA material.

The number of defects in the second self-assembled structure is less than the number of defects in the first self-assembled structure. Defects in a self-assembled lamellar structure, for example, include breaks in lamellae lines (point defects) and dislocations and disclinations (two-dimensional defects), as shown in the Examples below. Other defects would include floating lamellae, which do not extend through the SA film (three-dimensional defects). As used herein, the term "defects" refers to those defects that arise from the DSA process itself, and is not meant to include routine fabrication defects that are not inherent in the DSA process (e.g., defects related to undesired foreign particles and/or material, and line collapse arising from removing one of the domains).

Defects in a self-assembled cylindrical structure, for example, would include displacement errors, discontinuous cylindrical domains, and cylinders that do not extend through the SA film.

Defects may also be orientational in nature, for example, domains may be oriented parallel to the substrate when a perpendicular orientation is desired.

Figure 1D:
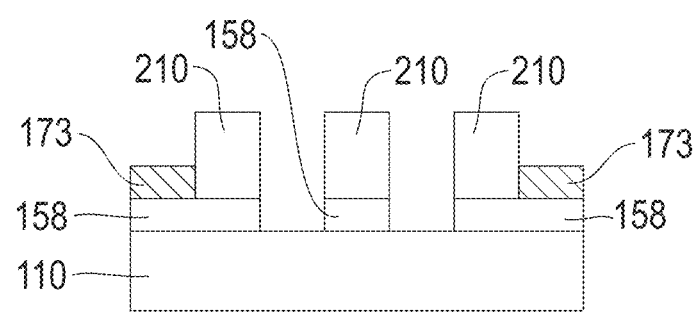
FIG. 1D is a schematic layer diagram showing the selective removal of polymer domains from the self-assembled structure.

Further, one of the domains can be selectively removed (e.g., ion-etched) or modified in the presence of the other domain, to generate topographical or chemical contrast, exemplified by the structure shown in FIG. 1D. As shown in this figure, selective removal of one of the domains may also remove underlying orientation control material. The resulting relief pattern of openings can have a spatial frequency greater than that of the chemically patterned surface. The selective removal process may be carried out by a thermal bake (for thermally decomposable materials), a reactive ion etch process, dissolution in a selective solvent, or a combination thereof. A chemical modification may be accomplished by a variety of known methods. For example, domains may be selectively reacted with silanes or silyl chlorides to introduce silicon content into a domain and thereby increase its plasma etch resistance. Alternatively, chemical agents may be used to bind or chemically couple to functional groups that are exclusively located in one type of self-assembled domain, to effect, for example, increased solubility property differences that can advantageously be used to selectively remove one domain in the presence of the other domain.

Figure 2A:
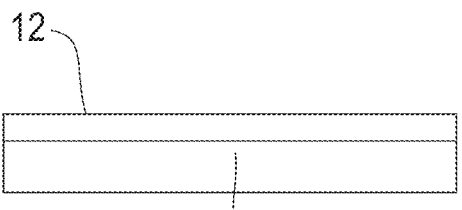
FIGS. 2A-2H are schematic layer diagrams showing one method of generating a sparse chemical pre-pattern using 193 nm immersion lithography.
Figure 2B:
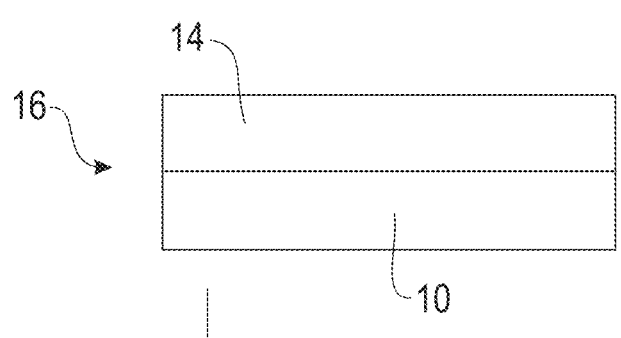
Figure 2C:
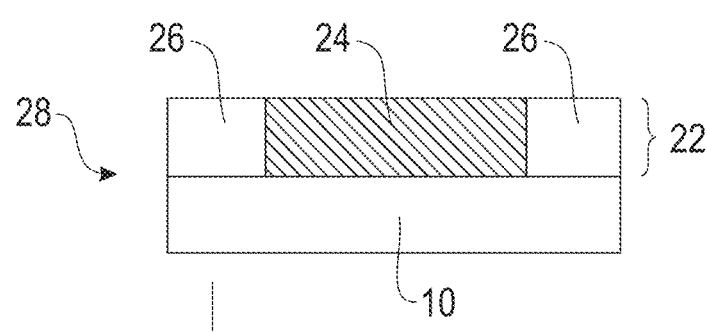
Figure 2D:
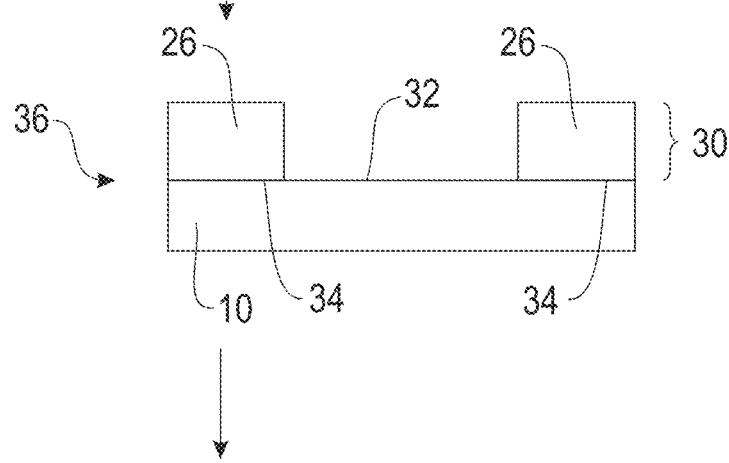

Another embodiment of the disclosed method is illustrated in the schematic layer diagrams of FIGS. 2A to 2L. Fabrication of the pre-pattern (shown in FIGS. 2A to 2H) is described in Cheng et al. *ACS Nano*, 2010, 4, 4815-4823. Substrate 10 of FIG. 2A has surface a 12, on which is disposed positive-tone photoresist layer 14 (FIG. 2B, structure 16). Pattern-wise exposure of photoresist layer 14 with radiation using a mask (not shown) produces exposed photoresist layer 22 (FIG. 2C, layered structure 28). Exposed photoresist layer 22 is given a post-exposure bake (not shown). Exposed photoresist layer 22 is composed of regions of exposed photoresist 24 and non-exposed photoresist 26. Positive-tone development using an aqueous alkaline developer, particularly tetramethylammonium hydroxide (TMAH), removes exposed photoresist 24, producing an initial layer 30 (i.e., initial patterned photoresist layer) comprising non-exposed photoresist 26 disposed on a first substrate surface 34 (FIG. 2D, structure 36). Second substrate surface 32 of substrate 10 is uncovered by development and has substantially no photoresist thereon. Initial layer 30 can be optionally rinsed or baked to remove residual solvent.

Figure 2E:
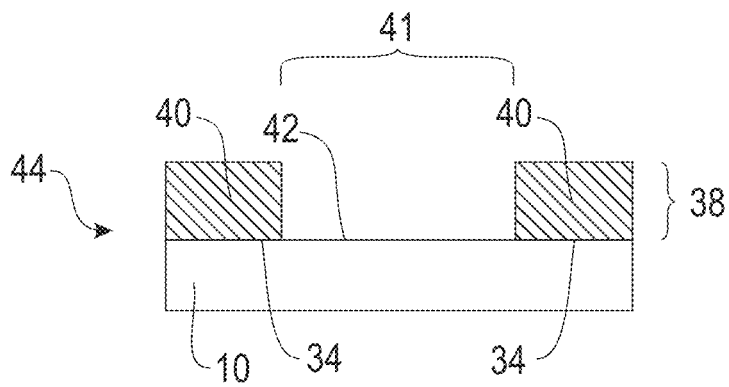

Initial layer 30 is treated photochemically, for example, by a deep UV flood exposure process and a post-exposure bake, to render non-exposed photoresist 26 insoluble in a first solvent used to cast an orientation control material and/or a second solvent used to cast a SA material, forming treated layer 38 (i.e., "treated patterned photoresist layer"; FIG. 2E, structure 44). Treated layer 38 comprises treated photoresist 40 disposed on first substrate surface 34. Treated photoresist 40 has less solubility in the first and/or second solvent compared to non-exposed photoresist 26 of FIG. 2D. Also shown is second substrate surface 42 of substrate 10, having a composition capable of binding an orientation control material.

Figure 2F:
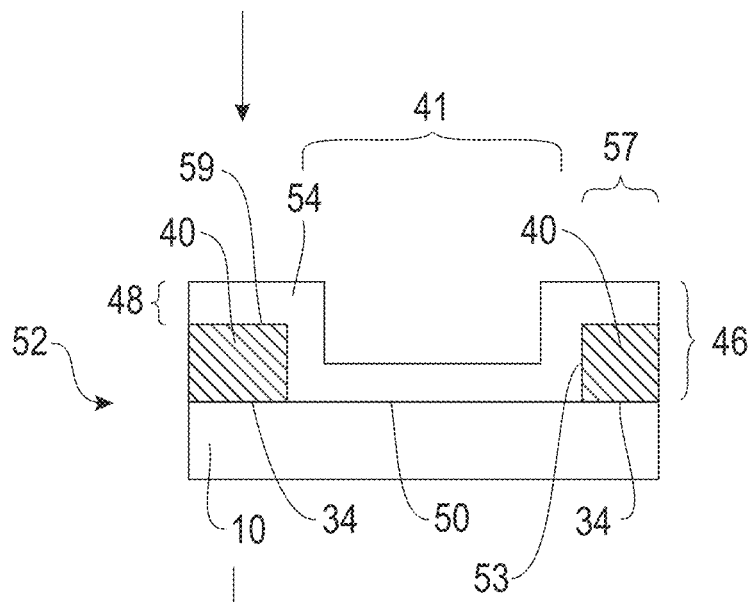
Figure 2G:
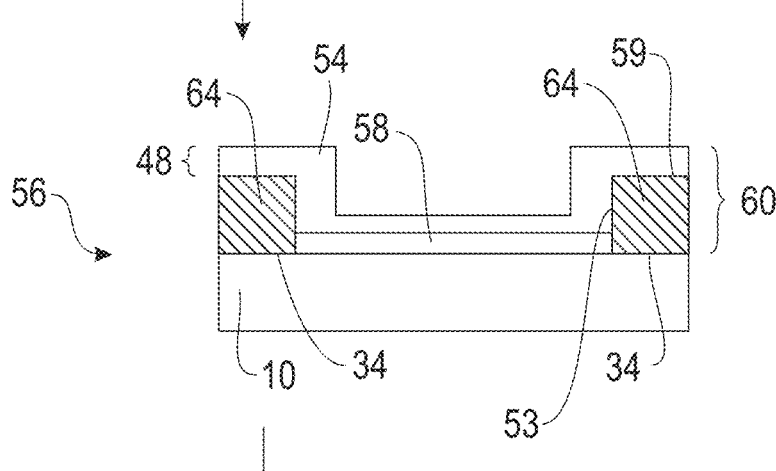

A solution of the orientation control material dissolved in a first solvent is then cast on the treated layer 38, which is not soluble in the first solvent. Removal of the first solvent provides layer 46 (FIG. 2F, structure 52) comprising photoresist features 57 comprising treated photoresist 40 disposed on first substrate surface 34, and orientation control layer 48 comprising orientation control material 54. As shown in FIG. 2F, orientation control layer 48 can be disposed on photoresist surface 59, sidewall 53, and second substrate surface 50. Alternatively, orientation control material 54 can be wholly or substantially located in the trench 41.

The orientation control layer 48 is then thermally treated to bind a portion of the orientation control material 54 to the second substrate surface 50. An acidic catalyst (formed by the thermolysis of a thermal acid generator) is utilized to accelerate the grafting reaction. The result is structure 56 (FIG. 2G) comprising layer 60 comprising bound orientation control material 58 and non-bound orientation control material 54. The bound orientation control material 58 is not soluble in a solvent utilized in a second development process described further below.

Figure 2H:
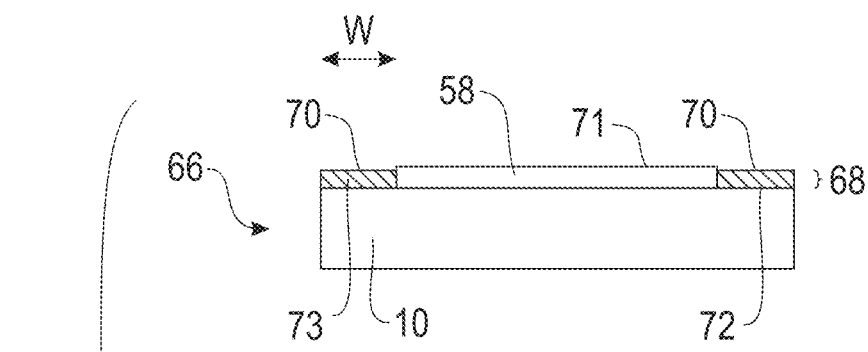

Structure 56 is submitted to a second development process using 0.26N TMAH to remove the treated photoresist 64 and any non-bound orientation control material 54, thereby resulting in structure 66 (FIG. 2H). Depending upon the degree of treatment, the photoresist can be completely removed to reveal the substrate surface 72, in which case the chemical pre-pattern would comprise first substrate surface 72 and second surface 71, wherein substrate surface 72 can be the pinning region (e.g., an ARC surface). Alternatively, some residual photoresist 73 may remain as shown, and the thin layer of highly polar, residual photoresist can serve as a hydrophilic pinning region.

The non-pinning region (second surface 71 comprising bound orientation control material) can support, for example, the perpendicular orientation of self-assembled domains.

Figure 2I:
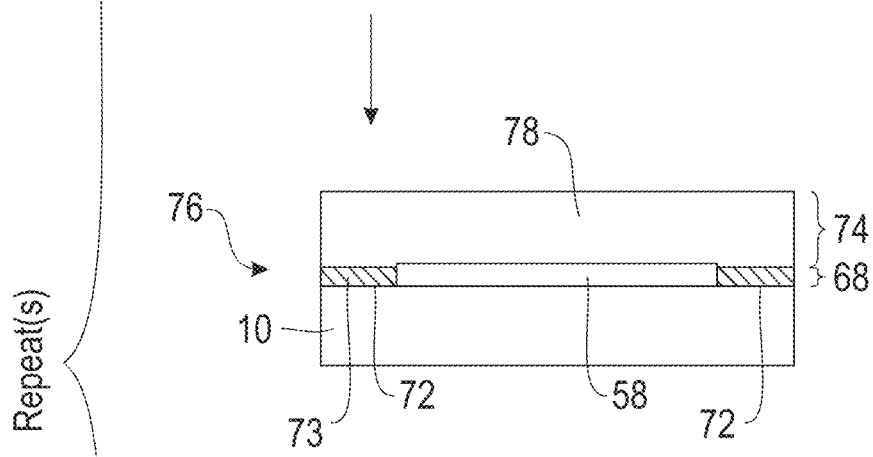

A solution is prepared comprising one or more SA materials dissolved in a second solvent. The solution is cast onto a chemically patterned surface 68 (FIG. 2H), followed by removal of the second solvent, thereby forming the first SA layer 74 (FIG. 2I, structure 76). The solution of SA material can additionally comprise other materials including polymers, block copolymers, surfactants, photoacid generators, and thermal acid generators. For example, an organosilicate resin can be included that is miscible with the poly(ethylene oxide) domains of poly(ethylene oxide-block-styrene) copolymer. In the first DSA step, the SA material 78 is allowed to phase separate and the resulting domains 84, 86 align as directed by the underlying chemical pre-pattern to form a first self-assembled structure 80 (which is part of structure 82, see FIG. 2J). Phase separation and alignment can occur during film formation, during a post-application bake, or during a subsequent annealing process. Suitable annealing processes include thermal annealing, thermal gradient annealing, solvent vapor annealing or annealing by other gradient fields. The first self-assembled structure 80 comprises a first domain 84 and a second domain 86 of SA material 78. The first and the second domains 84 and 86 comprise different components of SA material 78; that is, they are compositionally different. The first domain 84 can, for example, comprise one block of a block copolymer, and the second domain 86 can comprise a different block of a block copolymer.

The width (w) of the first substrate surface 70 (FIG. 2H) can be larger than the width (w') of the first domain 84 for which it has preferential affinity due to resolution limits of the lithographic tool. Therefore, more than a single domain can self-assemble on the first surface 70; however, the pitch of the chemical pre-pattern should be roughly commensurate with an integral multiple of the pitch of the self-assembled domains. In one embodiment, the width (w) of the first substrate surface 70 is approximately equivalent to the width (w') of the domain 84 for which it has preferential affinity. In another embodiment, the width (w) of the first substrate surface 70 is approximately equivalent to 1.5 times the width (w') of the domain 84 for which it has preferential affinity.

Figure 2J:
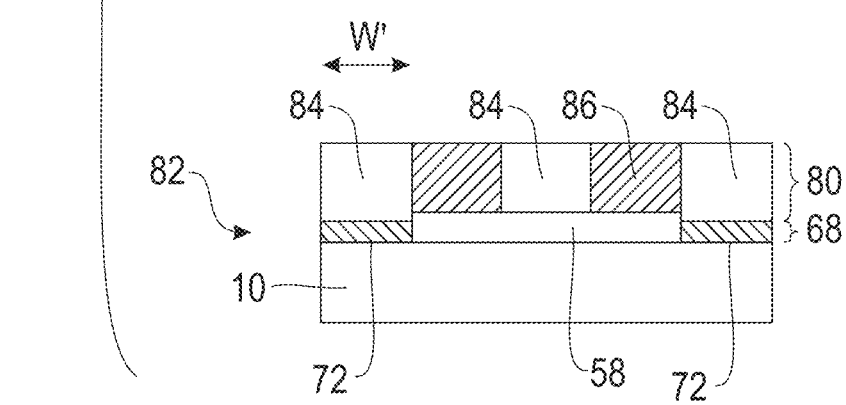

The width of the second surface 71 (FIG. 2H) is significantly larger than the width of the second domain 86. Therefore, more than a single domain can self-assemble on the second surface 71; however, the pitch of the chemical pre-pattern should be roughly commensurate with an integral multiple of the pitch of the self-assembled domains. For example, multiple domains 84 and 86 can self-assemble on top of the second surface 71 comprising bound orientation control material 58 (FIG. 2J).

After the first DSA step, all or substantially all the first self-assembled structure 80 is removed from the substrate using at least one solvent. In one embodiment, all or substantially all the first self-assembled structure 80 is removed from the substrate by applying a layer of solvent on top of the first self-assembled structure 80 and spinning the substrate dry.

The application of a layer of solvent may be accomplished by any method known in the art, including puddling, spraying, and/or dipping. During the removal process, dynamic wafer agitation by controlled rotation or sonication may be employed to assist the removal of the first self-assembled structure 80. In another embodiment, a combination of solvents is used. In yet another embodiment, a combination of solvents is used in a sequential manner. In yet another embodiment, the wafer is baked after the removal process to remove any remaining solvent.

After the first self-assembled structure 80 has been removed, what remains is a structure similar to that shown in FIG. 2H, but one that includes (it is believed, without wishing to be bound by theory) a chemical pre-pattern that has been slightly modified with respect to the original chemical pre-pattern. A second self-assembled structure is then constructed, using the techniques described above in connection with forming the first self-assembled structure of FIG. 2. Specifically, another solution is prepared comprising one or more SA materials dissolved in a solvent.

The solution is cast onto the modified, chemically patterned surface 68, followed by removal of the solvent, thereby forming the second SA layer (analogous to that shown in FIG. 2I). The solution of SA material can additionally comprise other materials including polymers, block copolymers, surfactants, photoacid generators, and thermal acid generators. For example, an organosilicate resin can be included that is miscible with the poly(ethylene oxide) domains of poly(ethylene oxide-block-styrene) copolymer. SA material is allowed to phase separate and the resulting domains align as directed by the underlying modified chemical pre-pattern 68 to form a second self-assembled structure (analogous to that shown in FIG. 2J). Phase separation and alignment can occur during film formation, during a post-application bake, or during a subsequent annealing process. Suitable annealing processes include thermal annealing, thermal gradient annealing, solvent vapor annealing or annealing by other gradient fields. The second self-assembled structure comprises a first domain and a second domain of SA material. The first and the second domains comprise different components of SA material; that is, they are compositionally different. The first domain can, for example, comprise one block of a block copolymer, and the second domain can comprise a different block of a block copolymer.

In one embodiment, the thickness of the second self-assembled structure pattern is greater than the thickness of the first self-assembled structure. In another embodiment the thickness of the second self-assembled structure is greater than 55 nm. In another embodiment the thickness of the second self-assembled structure is greater than twice than that of the characteristic pitch of the SA material.

The number of defects in the second self-assembled structure is less than the number of defects in the first self-assembled structure.

Figures 2K, 2L:
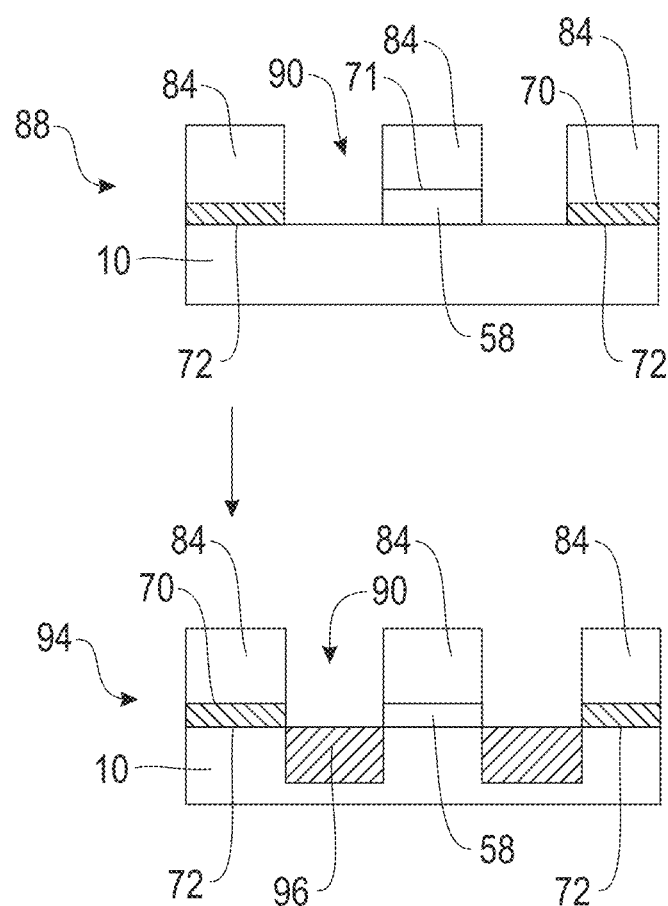
FIGS. 2K-2L are schematic layer diagrams showing the selective removal of polymer domains from the self-assembled structure as well as transfer of the pattern to the underlying substrate.

Further, one of the domains, for example the second domain can be selectively removed (e.g., ion-etched) or modified in the presence of the first domain, to generate topographical or chemical contrast, exemplified by structure 88 (FIG. 2K). As shown in FIG. 2K, selective removal of the second domain also removes underlying orientation control material producing a relief pattern comprising the first domain and, for example, openings 90. The relief pattern of openings 90 can have a spatial frequency greater than that of the chemically patterned surface. The selective removal process may be carried out by a thermal bake (for thermally decomposable materials), a reactive ion etch process, dissolution in a selective solvent, or a combination thereof. A chemical modification may be accomplished by a variety of known methods. For example, domains may be selectively reacted with silanes or silyl chlorides to introduce silicon content into a domain and thereby increase its plasma etch resistance. Alternatively, chemical agents may be used to bind or chemically couple to functional groups that are exclusively located in one type of self-assembled domain, to effect, for example, increased solubility property differences that can advantageously be used to selectively remove one domain in the presence of the other domain.

Finally, the relief pattern can be transferred to substrate 10, thereby forming altered regions 96 of substrate 10 (FIG. 2L, layered structure 94). Altered regions 96 can be a line, hole, pit, or a chemically altered state of substrate material. Altered regions 96 can extend into one or more layers of substrate 10. The pattern transfer can be accomplished, for example, by using a reactive ion etch process. In one embodiment, the pattern transfer to the underlying substrate is carried out at the same time as the selective removal of one of the domains of SA material.

Pattern transfer may be facilitated by a material stack. In one embodiment, the material stack may include a hard mask layer, which is an etch-resistant inorganic layer located underneath the pre-pattern layer and above an organic planarization layer (OPL). In one embodiment, the material stack may include an OPL directly underneath the chemical pattern layer. In one embodiment, the material stack can provide etch selectivity needed to transfer the composite pattern into underlying layers.

In certain cases, it may be desirable to invert the transferred pattern, which may be accomplished in a variety of ways. In an illustrative example, cavities formed by transfer of the pattern into the OPL may be filled with a fill material, such as a spin-on dielectric (SOD) material, having etch selectivity relative to the OPL in an etch. Optionally, the fill material may be treated to promote cross-linking or hardening. The OPL may be removed selective to the fill material to form a complementary pattern including fill material portions.

Similar embodiments based on sparse chemical patterns can be used to fabricate arrays of holes or posts. For example, coating a cylinder-forming BCP film of pitch $P_{BCP}$ (center-to-center distance between nearest cylinders) on a sparse chemical pattern consisting of hexagonally packed pinning dots of pitch, $P_S$, and neutral surface outside the dot areas will allow frequency multiplication of lithographically defined dots. Similar to line-space patterns, the frequency multiplication of hole/post arrays of a factor of $P_S/P_{BCP}$ can be achieved.

The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein. A substrate comprising a surface affinity material such as a silicon native oxide, silicon oxide, or silicon nitride can be preferentially wetted by, for example, PMMA block components, but not by PS block components of a PS-b-PMMA block copolymer. Therefore, surfaces comprising these surface affinity materials can direct self-assembly of a PS-b-PMMA block copolymer by chemical epitaxy. The substrate can have a top ARC layer or bottom ARC (BARC) layer to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Creation of the guiding pre-pattern can be accomplished using radiation of various types, including ultraviolet (UV) radiation of wavelengths from 400 nm to 300 nm, deep ultraviolet (DUV) radiation of wavelengths from 300 nm to 150 nm, extreme ultraviolet (EUV) radiation of wavelengths from 120 nm to 4 nm, electron-beam (e-beam) radiation, x-ray radiation, and combinations of the foregoing. Exemplary radiation sources include single wavelength and/or narrow band radiation sources, specific mercury emission lines, lasers, and particle beam emitters. For less stringent conditions, a broad band multiple wavelength source can be used. More specifically, the radiation wavelength for the pattern-wise exposure can be, for example, 405 nm, 313 nm, 334 nm, 257 nm, 248 nm, 193 nm, 157 nm, 126 nm, or 13.5 nm. Even more particularly, the wavelength of the radiation for the pattern-wise exposure can be less than 250 nm. In an embodiment, the radiation wavelength is selected from the group consisting of 248 nm, 193 nm, 157 nm, and 13.5 nm.

Any method known for creating chemical patterns known in the art may be used to create the chemical patterns. For example, direct writing of chemical patterns can be achieved by exposure of an orientation control layer (e.g., a surface-bound polymer brush or self-assembled monolayer) in an e-beam direct write lithography or EUV interference lithography process. Alternatively, a conventional photoresist can be patterned on top of an orientation control material to form patterned photoresist features. The photoresist pattern can protect the underlying surface during an etch process that creates pinning regions (i.e., a region having a particular affinity for one domain of a self-assembled material), either by removing the orientation control material to uncover the underlying substrate or by inducing enough damage to the orientation control material that it becomes preferential to one of the BCP self-assembled domains. The protecting photoresist layer can then be removed by an organic solvent rinse to produce the final chemical pattern.

Rather than selectively removing or altering an orientation control material, negative-tone photo-patternable orientation control materials have been developed that can be patterned on top of conventional anti-reflective coatings. Alternatively, direct patterning of a crosslinking negative-tone photoresist on top of an orientation control material can produce a chemical pattern. The best reported efforts have used a hydrogen silsesquioxane negative-tone e-beam photoresist (used herein in Example 1 and previously described in Cheng et al. *Adv. Mater.* 2008, 20, 3155-58 and U.S. Pat. Nos. 7,521,094 and 8,226,838).

A number of schemes compatible with conventional 193 nm immersion lithography have been reported that are also suitable, for example, the pattern first—neutralized last scheme used herein in Examples 2 and 3 and previously described in Cheng et al. *ACS Nano,* 2010, 4, 4815-4823. In an alternative method described in Liu et al. *Macromolecules* 2011, 44, 1876-1885, a photoresist is patterned on top of a crosslinked mat (in this case of crosslinked poly(styrene). A subsequent etch process is used to break through the mat to the underlying substrate and laterally trim the crosslinked mat. The resist is stripped and an orientation control material is grafted to the portions of the substrate not covered by the crosslinked PS mat.

Other techniques that may be used to create suitable chemical patterns include nanoimprint lithography, polymer inking/stamping, molecular transfer printing (including the technique described in Ji et al. *ACS Nano* 2010, 4, 599-609), dip-pen lithography, and nanoprobe lithography (including thermal, electron emission, and other variants).

Any method known for creating topographic patterns known in the art may be used to create the pre-patterns for graphoepitaxy. The topographical patterns may be comprised of photoresist (either crosslinked or otherwise stabilized), an anti-reflective coating (e.g., a bottom anti-reflective coating (BARC), a developable bottom anti-reflective coating (DBARC), a photosensitive bottom anti-reflective coating (PS-BARC), a silicon anti-reflective coating (SiARC)), an inorganic or metal hardmask layer, an organic planarization layer, a spin-on carbon layer, a dielectric layer, CVD carbon layer, an inorganic oxide layer, an inorganic nitride layer, and/or an inorganic carbide layer). The bottom surface of the topographic pre-pattern may be comprised of an orientation control material or other material with tuned surface properties. One method to preserve the surface properties of the orientation control material is to use a negative-tone imaging process with an organic developer to image a crosslinkable (or thermally hardenable) photoresist on top of the orientation control material. A polymer brush may be grafted to one of more surfaces of the topographic pattern. Other means of creating graphoepitaxial templates is the use of so-called sidewall image transfer (or self-aligned double patterning) techniques, where a conformal inorganic material is applied (usually by chemical vapor deposition or a similar process) over a mandrel. The mandrel can be removed to create a topographic structure with twice the spatial frequency. Variants of this process can be used to create topographic structures with triple or quadruple the frequencies of the initial mandrel structure.

In a graphoepitaxy DSA process, the SA material may be located within the topographical feature(s) (e.g., hole(s) or trenches(s)), with little or substantially no SA material on the top surface of the topographic pattern, or within the topographical feature(s) (e.g. hole(s) or trenches(s)), with a substantial amount of SA material on top surface of the topographic pattern.

Exemplary orientation control materials include polymers comprising a hydroxyl group. These include hydroxyl-terminated polymers (e.g., hydroxyl-terminated poly(styrene-co-methyl methacrylate and blends of hydroxyl-terminated poly(styrene), hydroxyl-terminated poly(methyl methacrylate), and poly(styrene-b-methyl methacrylate)), hydroxyl-functionalized polymers (e.g., poly(styrene-co-methyl methacrylate-co-2-hydroxyethyl methacrylate)). Other orientation control materials include materials comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly(styrene-co-methyl methacrylate-co-vinyl benzocyclobutane), and poly(alpha-methyl styrene-co-methyl methacrylate)). The reactive polymers may react as a result of thermal or photochemical treatment either alone or in conjunction with an additional crosslinking agent. In particular, a catalytic species such as a strongly acidic species may be used to facilitate reaction. The strongly acidic species may be directly incorporated into the orientation control material or the solution comprising the orientation control material. Alternatively, a thermal acid generator or photoacid generator molecule may be used to generate an acidic species as a result of thermal or photochemical treatment, respectively. The above materials are particularly suitable for use with an SA material comprising poly(styrene-b-methyl methacrylate) block copolymers. Poly(methyl glutarimide) (PMGI) can be an orientation control material for an SA material comprising poly(styrene-b-ethylene oxide) block copolymer.

Other non-limiting examples of orientation control materials include materials used in ARC layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (e.g., optical constants surface energy, and etch resistance). The polymer components also typically contain a plurality of reactive sites distributed along the polymer for reaction with a crosslinking component. More specific materials used in ARC layers include polymers disclosed in US Patent Application 20090186294, including poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl end-capped poly(bisphenol A-co-epichlorohydrin), and silicon-containing anti-reflection coating A940 from Shin Etsu. Another more specific orientation control material described in U.S. Pat. No. 7,521,090 comprises poly(styrene-co-epoxydicyclopentadiene methacrylate) random copolymer, P(S-r-EDCPMA):

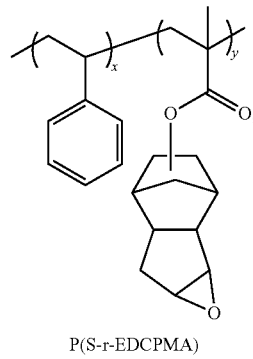

P(S-r-EDCPMA)

wherein x and y are each integers greater than 1. Other orientation control materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinnamate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI). Other orientation control materials comprise polymer brush layers including those formed by hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing surface affinity materials. Other orientation control materials include self-assembled monolayers.

The orientation control material layer can include, for example, a thin dielectric material having a thickness from 1 nm to 20 nm. In one embodiment, the orientation control layer includes a material having substantially the same affinity to two different polymeric block components within a self-assembling material layer to be subsequently applied thereupon. In one embodiment, the orientation control layer can include random polymers, i.e., polymers obtained by polymerization of random sequences of different types of monomers. In one embodiment, the orientation control layer includes an etch-resistant material.

The orientation control material layer includes a material having an orientation control surface that allows the domains of a self-assembling material to be subsequently applied thereupon to orient in a set direction with respect to the substrate. This direction may be substantially perpendicular to the substrate.

The mechanism for the orientation control by the orientation control material in any specific context is complicated. Without wishing to be bound by any specific theory, the mechanism for the orientation control by the orientation control material may depend on net surface energy, wetting characteristics, surface energy distribution, hydrogen bonding, net dipole moments, dipole moment density, or even composition. Materials creating the right characteristics for the orientation control material may include: a cross linked organic polymer including an epoxy-based homopolymer or copolymer; a surface modified organic homopolymer or copolymer;

a self-assembled monolayer, a polymer brush-modified layer, or a cross-linked organosilicate; random copolymer brushes, random cross-linked copolymers, or mixtures of polymer brushes or cross-linked polymers; some ARC materials, or even a properly and precisely oxidized silicon surface.

Polymer brushes can provide an orientation control surface, in which the surface is reactively modified to the desired thickness and surface properties using polymeric brush precursors with a desired composition, often followed by an additional rinse step to remove non-bound material. The composition of a random copolymer brush layer is tuned to afford the desired orientation control surface. This can be accomplished in some instances by randomly copolymerizing two monomers, for example the same monomers used in the self-assembling material (for the self-assembling material assembly), in a precise ratio. In instances where otherwise useful self-assembling materials (i.e., those that can form domains) exist for which it is unfeasible to synthesize random copolymers of repeating units of each polymeric block components (such as where different polymerization mechanisms would be required), end-group functionalization or incorporation of reactive-group containing monomers can be used to functionalize a polymers to provide grafting sites. [See, e.g., P. Mansky, Y. Liu, E. Huang, T. P. Russell, C. Hawker, "Controlling polymer surface interaction with random copolymer brushes," Science, 275, 1458, (1997).] Thermally crosslinkable underlayers based on, for example, vinyl benzocyclobutene, may also be used. [See, e.g., Du Yeol Ryu, Kyusoon Shin, Eric Drockenmuller, Craig J. Hawker, and Thomas P. Russell, "A generalized approach to modification of solid surfaces" Science, 308, 236, (2005).] Photopatternable underlayers, based on random copolymers of the monomers of the self-assembling material with an appropriate functional monomer, for example, monomers having azide, glycidyl or acryloyl groups, may also be used. [See, e.g., Joona Bang, Joonwon Bae, Peter Lowenhielm, Christian Spiessberger, Susan A. Given-Beck, Thomas P. Russell, and Craig J. Hawker, "Facile routes to patterned surface neutralization layers for block copolymer lithography," Advanced Materials, vol. 19, p. 4552 (2007).]

The orientation control surface can also be provided by use of a coating of a crosslinked epoxy-containing polymer prepared from monomers including glycidyl (meth)acrylate, 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and combinations including at least one of the foregoing. Herein, where "(meth) acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further containing at least one additional monomer in addition to the epoxy-containing monomer. Exemplary additional monomers include methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth) acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth) acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, a-methyl styrene, 4-hydroxy styrene, 4-acetoxy styrene, ethylene, propylene, 1-butene, 1,3-butadiene, vinyl acetate, dihydropyran, norbornene, maleic anhydride, or a combination including at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Useful exemplary glycidyl methacrylate polymers are described by Gopalan et. al. [Eungnak Han, Insik In, Sang-Min Park, Young-Hye La, Yao Wang, Paul F. Nealey, and Padma Gopalan, "Photopatternable imaging layers for controlling block copolymer microdomain orientation," Advanced Materials, vol. 19, pp. 4448 (2007)]. In an embodiment, specifically useful epoxy-containing polymers include poly(epoxydicyclopentadienyl methacrylate) homopolymer or poly(styrene-ran-epoxydicyclopentadienyl methacrylate), a random copolymer of styrene and epoxydicyclopentadienyl methacrylate.

Organosilicate or silicon oxide-based coatings on the substrate can also be used to provide the orientation control surface. In an embodiment, useful surfaces may be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials may be used to provide the orientation control surface, where such organosilicate coatings are advantageously crosslinkable to form a solid orientation control surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis(triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

The orientation control layer may be comprised of an etch-resistant material including, but not limited to, a material selected from hydrogen silsesquioxane, methyl silsesquioxane, an alkyl silsesquioxane, an alkene silsesquioxane, an aryl silsesquioxane, an arylene silsesquioxane, a silicon-based resist, an inorganic resist, a silicon-based ARC, a metal-based ARC, silicon oxide, a silicon oxynitride, a silicon-based spin-on-dielectric, a metal, a metal oxide, a metal nitride, a metal oxynitride, and a metal carbide, provided that a suitable etch chemistry exists for removing some domains of a self-assembling material selectively to other domains and the etch-resistant material. In one embodiment, the etch-resistant material can include hydrogen silsesquioxane.

A layer of such etch-resistant material formed on the substrate can be deposited by any suitable method and is not particularly limited. Where the etch-resistant material is soluble in solutions, the application of an etch-resistant material layer to a surface of the substrate can be accomplished by a process including, for example, spin-casting, dip-coating, doctor blading, spray dispense, or other suitable coating method, which is compatible with the processes and equipment used in microelectronics fabrication assembly lines.

Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

In another example, the etch-resistant material can be deposited from the vapor phase by a process including, chemical vapor deposition (CVD), plasma enhanced CVD, atomic layer deposition (ALD), sputtering, thermal evaporation, electron beam evaporation, pulsed laser deposition, or other suitable deposition method that is compatible with the processes and equipment used in microelectronics fabrication.

An orientation control material layer formed on the substrate can be applied by any suitable method and is not particularly limited. Where polymer-based orientation control material is desired, the application of such layers to a surface of the substrate can be accomplished by a process including, for example, spin-casting, dip-coating, doctor blading, spray dispense, or other suitable coating method, which is compatible with the processes and equipment used in microelectronics fabrication assembly lines.

Solvents that can be used to deposit polymeric coatings for the orientation control material layer vary with the solubility requirements of these materials. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone.

The surface energy or composition required for the orientation control layer depends on the application. For example, in order to form polystyrene (PS)-poly(methyl methacrylate) (PMMA) perpendicular lamellae, a PS-r-PMMA random copolymer layer may be employed as the orientation control material in order to make the lamellae stand up with substantially vertical interfaces between them. In one embodiment, for an unpatterned surface, the brush composition may be from 57% PS to 70% PS. However, the ideal orientation control material for a patterned surface (e.g., one having a chemical pre-pattern) may differ from that designed for an unpatterned surface, and the ideal orientation control material may depend upon the composition of the directing portion of the chemical pattern (e.g., PS or PMMA preferential) and the multiplication factor, as described in Liu et al. *Macromolecules* 2013, 46, 1415-1424. The multiplication factor for spatial frequency multiplication refers to the ratio of the pitch of the chemical pre-pattern to the periodicity of a self-assembling material. The ideal orientation control material may be different for different BCP morphologies (e.g., perpendicular cylinders vs. lamellae).

For a given orientation control material, the efficacy of the orientation control at a particular composition can depend on the thickness of the orientation control material layer. The molecular architecture of the orientation control material can have an effect. For example, a polymer brush orientation control material may have a composition range different than that of a cross-linked orientation control material due to difference in mobility of the brush. For the same reason, a higher molecular weight brush may act differently from a lower molecular weight brush. Similar changes in the efficacy of orientation control may be observed for cross-linked orientation control materials having the same composition but different molecular weights. The efficacy of orientation control may also depend on the thickness of the self-assembly material layer above the orientation control material layer according to the relative difference in surface free energies among the polymeric block components. The exact orientation of polymer domains at the air interface or the polymer/orientation control interface may not be perpendicular to the substrate, even if the majority of each polymer domain is. The orientation-control material may still function even when it is weakly preferential. In some embodiments, the orientation control material may not cause polymer domains to stand perpendicular to the substrate. For example, spheres or parallel cylinders may be employed as shapes of a phase-separated polymeric component in order to subsequently create hole patterns or line patterns.

Controlling the air interface as well as the underlying surface has been shown to be helpful in obtaining perpendicularly-oriented (relative to the substrate) polymer domains for block copolymer systems with high Flory-Huggins interaction parameters (so-called high chi BCPs). One method of controlling this interface is to apply a topcoat layer on top of the self-assembly material, as described in Bates et al. *Science* 2012, 338, 775-779. Alternatively, the upper surface of the SA material may be placed in physical contact with another surface (e.g., another structure such as a wafer or pad having tuned surface properties) during the self-assembly or annealing steps. The incorporation of additives such as surfactants into the SA material has also been shown to assist in obtaining perpendicularly-oriented domains, as described in Son et al. *Adv. Mater.* 2008, 20, 3643-3648 and Son et al. *Macromolecules* 2012, 45, 150-158. Other suitable additives may include nanoparticles and homopolymers.

SA materials are comprised of immiscible materials that can phase segregate into domains. Phase segregation can be found in different types of polymer blends (e.g., binary, ternary) as well as block copolymers comprising two or more different polymeric block components.

SA materials for directed self-assembly can comprise immiscible polymer blends. The term "immiscible" as used herein refers to two or more polymers in the polymer blend being incompatible enough to drive phase segregation under certain process conditions. The immiscibility of the polymers in the polymer blends can depend on the composition as well as the film forming process of the polymer blends. The ratio of the polymers, molecular weights of the individual polymers in the blend, and the presence of other additional components in the blend can be used to adjust the compatibility of the polymers in the polymer blend. Temperature, coating conditions, the treated photoresist topography, treated photoresist surface properties, and substrate surface properties can also affect the phase segregation of the polymers. As used herein, an "immiscible polymer" is a polymer that in a polymer blend composition phase segregates on a properly prepared substrate surface under appropriate process conditions.

Examples of suitable polymers for the two or more immiscible polymers include: cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluoro styrene), and substituted derivatives thereof. The two or more immiscible polymers can be selected such that each polymer is immiscible with each other polymer in the blend.

The SA material can comprise a block copolymer, or blends of block copolymers and other polymers. In an embodiment, the block copolymer consists essentially of a first polymeric block component A and a second polymeric block component B that are immiscible with each other. Typically, homopolymers of suitable immiscible block components form a blend that exhibits multiple glass transition temperatures representing each homopolymer phase. Preferably, one of the components A and B is selectively removable without having to remove the other, so as to form isolated and orderly arranged structural units composed of the un-removed component, or a continuous structural layer containing isolated and orderly arranged cavities formed after the removable component has been removed. Alternatively, the components A and B can simply have different electrical, optical, and/or magnetic properties, so that the ordered patterns composed of such components A and B can be used for fabricating different device structures.

The block copolymer can comprise blocks comprising one or more monomers, and at least two blocks in the block copolymer are compositionally, structurally, or both compositionally and structurally non-identical. Suitable block copolymers include di-block copolymers, tri-block copolymers, or multi-block copolymers, any of which can be used in conjunction with DSA to further enhance the resolution. The blocks themselves can be homopolymers or copolymers, including terpolymers. The SA material, which forms phase separated structures of chemically different domains, can comprise an amphiphilic organic block copolymer, amphiphilic inorganic block copolymer, organic di-block copolymer, organic multi-block copolymer, inorganic-containing di-block copolymer, inorganic-containing multi-block copolymer, linear block copolymer, star block copolymer, dendritic block copolymer, hyperbranched block copolymer, graft block copolymer, a bottle brush block copolymer, or a combination comprising at least one of the foregoing block copolymers. In an embodiment, the block copolymer is a di-block copolymer. Combining a suitable tri-block copolymer and a chemical pre-pattern can, for example, be used to quadruple the spatial frequency of the chemical pre-pattern.

The block components can in general be any appropriate microdomain-forming block that can be copolymerized with, attached to, or self-organize with another dissimilar block. Blocks can be derived from different polymerizable monomers, where the blocks can include but are not limited to: polyolefins including polydienes, polyethers including poly(alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, and the like.

In an embodiment, the blocks of the block copolymer comprise repeating units derived from $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or alpha-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers can be used. Exemplary blocks that are homopolymers include blocks prepared using styrene (i.e., polystyrene blocks), or (meth)acrylate homopolymer blocks such as poly(methyl methacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride dyad repeating structure due to the inability of maleic anhydride to homopolymerize under most conditions (e.g., poly(styrene-alt-maleic anhydride)) where "-alt-" indicates alternating polymeric blocks. It is understood that such blocks are exemplary and should not be considered to be limiting.

More specific di-block or tri-block copolymers include poly(styrene-b-vinyl pyridine) (PS-b-PVP), poly(styrene-b-butadiene) (PS-b-PBD), poly(styrene-b-isoprene) (PS-b-PI), poly(styrene-b-methyl methacrylate) (PS-b-PMMA), poly(styrene-b-alkenyl aromatics), poly(isoprene-b-ethylene oxide) (PI-b-PEO), poly(styrene-b-(ethylene-propylene)), poly(ethylene oxide-b-caprolactone), poly(butadiene-b-ethylene oxide) (PBD-b-PEO), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-dimethylsiloxane) (PS-b-PDMS), poly(styrene-b-ferrocenyldimethylsilane) (PS-b-PFS), poly(styrene-b-isoprene-b-ethylene oxide) (PS-b-PI-b-PEO), poly(styrene-b-isoprene-b-methyl methacrylate) (PS-b-PI-b-PMMA), poly(styrene-b-ferrocenyldimethylsilane-b-isoprene) (PS-b-PFS-b-PI), poly(styrene-b-lactide) (PS-b-PLA) or a combination comprising at least one of the foregoing block copolymers.

Additional exemplary block copolymer materials are described in U.S. Pat. No. 7,605,081 to Yang et al., issued on Oct. 20, 2009, which is incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-blockpolybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). Other exemplary block copolymers that are contemplated for use in the present method include diblock or triblock copolymers such as, poly(styrene-b-alkenyl aromatics), poly(styrene-b-(ethylene-propylene)), poly(ethylene oxide-b-caprolactone), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-dimethylsiloxane), poly(vinyl pyridine-b-dimethylsiloxane), poly(ethylene oxide-b-dimethylsiloxane), poly(methyl methacrylate-b-dimethylsiloxane), poly(isoprene-b-dimethylsiloxane), poly(isoprene-b-vinyl pyridine), partially epoxidized poly (styrene-b-isoprene) poly(butadiene-b-vinyl pyridine), poly(trimethylsilyl styrene-b-lactic acid), poly(styrene-b-lactic acid), poly(styrene-b-hydroxystyrene), poly(styrene-b-acrylic acid), poly(ethylene oxide-b-hydroxystyrene), poly(methyl methacrylate-b-vinyl pyridine), poly(ethylene oxide-b-methyl methacrylate-b-styrene), poly(styrene-b-isoprene-b-ethylene oxide), poly(methyl methacrylate-b-styrene-b-methyl methacrylate), poly(isoprene-b-styrene-b-ferrocenyldimethylsilane), poly(styrene-b-trimethylsilyl styrene-b-styrene) or a combination including at least one of the foregoing block copolymers.

The polymer blend or block copolymers can also comprise inorganic constituents, including inorganic-containing homopolymers, copolymers, and block copolymers, and inorganic-containing monomers, molecules, and additives. These include, for example, those based on silicon, germanium, iron, titanium, aluminum, or the like. Exemplary silicon- and germanium-containing monomers and polymers can include those disclosed by H. Ito in "Chemical Amplification Resists for Microlithography" *Adv. Polym. Sci.*, vol. 172, pp. 37-245 (2005); exemplary metal containing monomers and polymers include those disclosed by Ian Manners in "Synthetic Metal-containing Polymers", Wiley-VCH, 2004; exemplary silicon-containing molecules and additives such as organosilicates include those disclosed by E. M. Freer, L. E. Krupp, W. D. Hinsberg, P. M. Rice, J. L. Hedrick, J. N. Cha, R. D. Miller, and H. C. Kim in "Oriented mesoporous organosilicate thin films", *Nano Letters*, vol. 5, 2014 (2005); and exemplary metal-containing molecules and additives include those disclosed by Jinan Chai, Dong Wang, Xiangning Fan, and Jillian M. Buriak, "Assembly of aligned linear metallic patterns on silicon", *Nature Nanotechnology*, vol. 2, p. 500, (2007).

The block copolymer desirably has an overall molecular weight and polydispersity amenable to further processing. In an embodiment, the block copolymer has a weight-averaged molecular weight ($M_w$) of 3,000 to 200,000 g/mol. Similarly, the block copolymer has a number averaged molecular weight ($M_n$) of 1,000 to 80,000. The block copolymer can also have a polydispersity ($M_w/M_n$) of 1.01 to 6, and is not particularly limited thereto. Molecular weight, both $M_w$ and $M_n$, can be determined by, for example, gel permeation chromatography using a universal calibration method, calibrated to polystyrene standards.

The block copolymers can be prepared by methods previously described in the art, including living polymerization techniques such as atom transfer free radical polymerization (ATRP) nitroxide-mediated radical polymerization, ring-opening metathesis polymerization (ROMP), and living cationic or living anionic polymerizations.

In a particular embodiment, the block copolymer used for forming the self-assembled periodic patterns is PS-b-PMMA. The PS and the PMMA blocks in such a PS-b-PMMA block copolymer can have a total (summed over all blocks) number average molecular weight ($M_n$) ranging from about 5 kg/mol to about 300 kg/mol, with a total number average molecular weight from about 10 kg/mol to about 100 kg/mole being more typical. Each block can have a $M_n$ of 1 to 299 kg/mol, more particularly 1 to 99 kg/mol.

The morphology (e.g., shape, dimension, and orientation) of the self-assembled domains from block copolymer thin films is a function of composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement). Therefore, by adjusting one or more parameters, the morphology can be adjusted to the need of specific applications.

In order to form the self-assembled periodic patterns, the block copolymer can be first dissolved in a suitable solvent system to form a block copolymer solution, which can then be applied onto the treated layer, thereby forming a thin block-copolymer layer disposed thereon. Optionally annealing the thin block-copolymer layer can aid in the self-assembly process of the polymeric block components.

In order to form the self-assembled periodic patterns, the block copolymer can be first dissolved in a suitable solvent system to form a block copolymer solution, which can then be applied onto the pre-pattern, thereby forming a thin block-copolymer layer disposed thereon. Optionally annealing the thin block-copolymer layer can aid in the self-assembly process of the polymeric block components.

In an embodiment, the SA material comprises at least one block copolymer. Non-limiting exemplary solvents for the SA material include substituted or unsubstituted aromatic hydrocarbons, substituted or unsubstituted aromatic ethers, substituted or unsubstituted aromatic alcohols, saturated monoalcohols comprising 5 to 20 carbons, glycols, ketones, glycol mono ethers, and glycol mono ether esters. In an embodiment, the SA solvent is a glycol, glycol mono ether, or glycol mono ether ester, or combinations thereof. More specific solvents for the SA material include but are not limited to toluene, ethylene glycol, propylene glycol, propylene glycol monomethyl ether acetate (PGMEA), propylene glycol monomethyl ether (PGME), 4-methyl-2-pentanol, n-butyl acetate, anisole, acetone, and combinations thereof. In an embodiment, the solvent for the SA material is ethylene glycol, propylene glycol, propylene glycol monomethyl ether acetate (PGMEA), propylene glycol monomethyl ether (PGME), 4-methyl-2-pentanol, or combinations thereof. The solution of SA material can have a concentration ranging from about 0.1 weight percent (wt. %) to about 5 wt. % SA material based on total weight of the solution. More particularly, the SA material is dissolved at a concentration ranging from about 0.5 wt. % to about 2.5 wt. %. In an embodiment, the solution of SA material comprises about 0.5 wt. % to about 2.5 wt. % PS-b-PMMA block copolymer dissolved in anisole. The solution of SA material can optionally further comprise additional block copolymers, homopolymers, random copolymers, surfactants, and photoacid generators, photobase generators, thermal acid generators, thermal base generators, acid amplifiers, and photodestructible bases.

The application of SA materials to a surface of the substrate can be accomplished by a process including, for example, spin-casting, dip-coating, doctor blading, spray dispense, or other suitable coating method, which is compatible with the processes and equipment used in microelectronics fabrication assembly lines.

The solution of SA material is cast on the pre-pattern followed by removal of the solvent, thereby forming a thin film of the SA material (i.e., SA layer) disposed on one or more surfaces of the pre-pattern. In an embodiment, the SA material is substantially disposed in the trench of the treated layer. The solution of SA material can be cast by any suitable technique, including, but not limited to: spin coating, roll coating, spraying, ink coating, dip coating, and the like. Additional annealing (including thermal annealing, thermal gradient annealing, and solvent vapor annealing or other gradient field) can be optionally employed to remove defects in the SA layer and/or promote self-assembly of the SA material. More particularly, the SA layer comprising a block copolymer is thermally annealed at a temperature that is above the glass transition temperature ($T_g$) of the block copolymer but below the decomposition or degradation temperature ($T_d$) of the block copolymer. The thermal annealing step can be carried out at an annealing temperature of about 100° C. to about 300° C. The thermal annealing can be performed for a period of more than 0 hours to about 100 hours, and more particularly for about 1 hour to about 15 hours. The thermally annealed block copolymer self-assembles to form ordered domains whose orientation can be perpendicular to the underlying surface plane. In general, the SA material can have a thickness of 100 to 10000 angstroms, more particularly 200 to 5000 angstroms, and even more particularly 300 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of holes that can be transferred into the underlying substrate. Types of etching include any common etching applied in the manufacture of semiconductor devices, for example, dry-etching such as plasma etching, or wet-etching using selective solvents. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

Also disclosed is the layered structure formed by the above-described method. In an embodiment, the layered structure is a semiconductor device. The method can be used to form layered structures comprising metal wiring lines, holes for contacts or vias, insulation sections (e.g., damascene trenches or shallow trench isolation), and trenches for capacitor structures suitable for the design of integrated circuit devices. The method is especially useful in the context of creating patterned layers of oxides, nitrides or polysilicon.

When the SA material is a block copolymer or blend containing a block copolymer, the method advantageously allows self-assembled structures having reduced feature width and increased periodicity relative to the pre-pattern feature(s). In this case, the domain feature width can be from 1 to 50 nm, from 1 to 30 nm, or more particularly from 1 to 20 nm. When the SA material is an immiscible polymer blend, the method permits a photoresist feature size less than 200 nm, more particularly less than 150 nm, and even more particularly less than 100 nm. The domain feature sizes tend to be larger, ranging from 1 to 500 nm, from 1 to 250 nm, or more particularly from 1 to 150 nm. Secondly, the method advantageously utilizes a self-assembled material with reduced feature size and an increased the periodicity relative to the pre-pattern.

The following non-limiting examples are provided to further illustrate the disclosed methods.

EXAMPLES

Materials used in the following examples are listed in Table 1.

TABLE 1

| Material | Description | Company |
|---|---|---|
| HSQ | XR-1541 negative-tone hydrogen silsesquioxane electron beam resist. | Dow Corning |
| ARX3538JN | 193 nm non-crosslinking positive-tone photoresist capable of chemical amplification | JSR |
| TCX-041 | Immersion topcoat | JSR |
| A940 | Si-containing bottom anti-reflection coating | Shin Etsu |
| ODL 102 | Organic planarizing layer | Shin Etsu |
| TMAH | 0.26N Tetramethylammonium hydroxide developer solution; OPTIYIELD CD | Fuji Film |
| PS-b-PMMA (22k-22k) | Poly(styrene-b-methyl methacrylate) block copolymer; $M_n$ = 22k of each block | Polymer Source Inc. |
| PS-b-PMMA (18k-18k) | Poly(styrene-b-methyl methacrylate) block copolymer; $M_n$ = 18k of each block | Polymer Source Inc. |
| P(S-r-MMA-r-GMA) | Poly(styrene-co-methyl methacrylate-co-glycidylmethacrylate) random copolymer (ratio of S:MMA:GMA = 56:42:2 by mole, $M_n$ = 12.1 kg/mol) | IBM (non-commercial, see below for details) |
| P(S-r-EDCPMA) | poly(styrene-co-epoxydicyclopentadiene methacrylate) random copolymer (S:EDCPMA = 70:30 by mole, $M_n$ = 5.8k) | IBM (non-commercial, see below for details) |

Preparation of Orientation Control Material P(S-r-MMA-r-GMA) and its Formulation.

Poly(styrene-co-methyl methacrylate-co-glycidyl methacrylate) random copolymer was prepared by free-radical polymerization of styrene, methyl methacrylate, and glycidyl methacrylate in a molar feed ratio of 58:40:2 (isolated polymer composition: 56:42:2 as determined by $^{13}C$ NMR). $M_n$=12.1 kg/mol. PDI: 1.59. A PGMEA solution of P(S-r-MMA-r-GMA) and p-NBT (p-nitrobenzyltosylate) [95:5 w/w ratio] was used as the formulation for forming an orientation control layer for PS-b-PMMA. See Cheng et al. *ACS Nano*, 2010, 4, 4815-4823 for details regarding preparation of this material.

Preparation of Orientation Control Material P(S-r-EDCPMA) and its Formulation.

Poly(styrene-co-epoxydicyclopentadiene methacrylate) random copolymer was prepared by free-radical polymerization of styrene and epoxydicyclopentadiene methacrylate in a mole ratio of 70:30 according to the method described in U.S. Pat. No. 7,521,090, which is hereby incorporated by reference. $M_n$=5819 g/mol. PDI: 1.51. A PGMEA solution of poly(styrene-co-epoxydicyclopentadiene methacrylate) and N-phthalimide triflate [95:5 w/w ratio] was used as the formulation for forming a orientation control layer for PS-b-PMMA.

Example #1A

Single DSA Using E-Beam Defined Chemical Pre-Pattern (Comparative Example)

Chemical guiding pre-patterns with 57.5 nm grating-pitch were generated by exposing a positive-tone e-beam resist (HSQ) on a substrate coated with a crosslinked layer of P(S-r-EDCPMA) using e-beam lithography, performing a post-exposure bake, and developing the non-exposed regions with a standard aqueous alkaline developer (0.26N TMAH) as described in Cheng et al. *Adv. Mater.* 2008, 20, 3155-58 and U.S. Pat. Nos. 7,521,094 and 8,226,838, which are hereby incorporated by reference. A solution of PS-b-PMMA block copolymer (18 k-18 k from polymer source, 28.8 nm pitch) with 1.25% w/w solid content in PGMEA was spin-coated on the chemical guiding pre-pattern at 3000 rpm for 30 seconds and annealed at 200° C. for 11 min to form a directed self-assembled structure as shown in the AFM image (FIG. 3A).

Example #1B

Double DSA Using E-Beam Defined Chemical Pre-Pattern (Inventive Example)

Figure 3B:
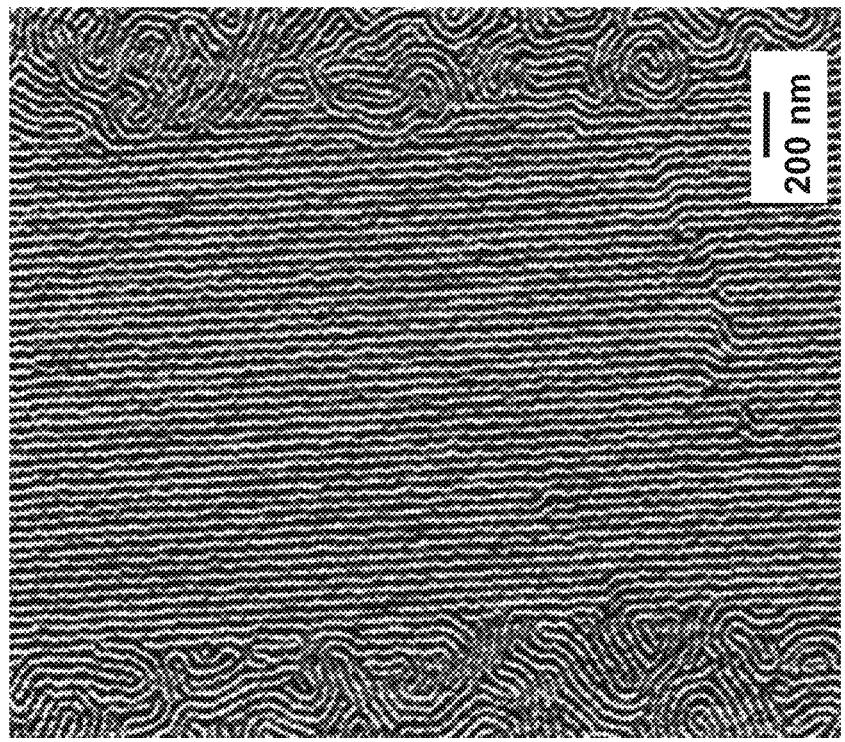
FIG. 3B is an AFM image of a second DSA structure comprised of PS-b-PMMA formed by the inventive double DSA process.
Figure 3A:
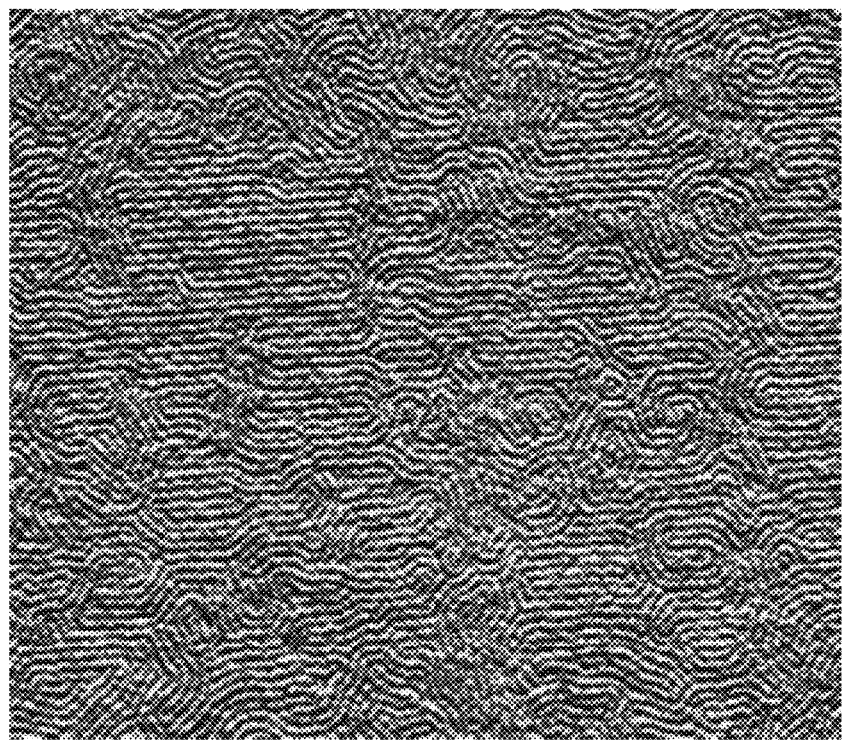
FIG. 3A is an AFM image of a first directed self-assembled structure comprised of PS-b-PMMA formed by a single DSA process.

FIG. 3B shows that the numbers of defects can be significantly reduced by employing the inventive method as follows. A solution of PS-b-PMMA block copolymer (18 k-18 k from polymer source, 28.8 nm pitch) with 1.25% w/w solid content in PGMEA was spin-coated on the chemically pre-patterned substrate (prepared in the same manner as in Example 1A) at 3000 rpm for 30 seconds and annealed at 200° C. for 1 min to form a first directed self-assembled structure. A solvent rinse was done by casting PGMEA on the DSA structure for 30 s and spinning dry the sample to remove any solvent and all or substantially all of the DSA structure. A second application of PS-b-PMMA block copolymer (18 k-18 k, 28.8 nm pitch) was applied on the rinsed structure by spin-coating from a 1.25% w/w solid content in PGMEA at 3000 rpm for 30 sec. Baking the substrate at 200° C. for 11 min generated a second DSA structure (shown in the AFM image in FIG. 3B) having fewer defects than that of the first DSA structure (shown in the AFM image in FIG. 3A).

Example #2

Double DSA Using 193i-Defined Pre-Patterns

Preparation of Chemical Pre-Patterns Using 193i

Chemical guiding pre-patterns with 100 nm grating-pitch were generated by pattern-wise exposing a stack comprising a 90 nm thick layer of topcoat (JSR TCX-041) on a 70 nm thick positive-tone 193 nm photoresist (JSR AX3538) on a 35 nm thick silicon-containing antireflection coating (Shin Etsu SHB A940) on a 100 nm thick organic planarization layer (Shin Etsu ODL 102) on a 300 mm silicon wafer using ArF immersion lithography (ASML 1950i, 1.35 NA, Dipole 35×, 0.87/0.779 illumination with y-polarization) at Albany Nanotech, performing a post-exposure bake at 110° C. for 60 s, and removing the topcoat and developing the exposed regions with a standard aqueous alkaline developer (0.26N TMAH) in a manner analogous to that described in Cheng et al. *ACS Nano*, 2010, 4, 4815-4823. The wafer was cleaved into smaller pieces and a polarity switch/hardening process was carried out by exposing the generated guiding pattern to broadband DUV light from a Hg/Xe 500 W short-arc lamp (UXM-501MA-Ushio America) with a total flood exposure dose of 60 mJ/cm2, followed by a hard-bake at 115° C./60 s and 185° C./120 s. After hardening the resist, a neutralization material P(S-r-MMA-r-GMA) with thermal acid generator was then cast on the hardened guiding pattern and baked at 215° C. for 2 mins. The guiding pattern was brought into contact with a standard aqueous alkaline developer (0.26N TMAH) for 30 s, followed by a DI water rinse to remove the hardened guiding resist pattern while maintaining the orientation control material on the surface. The process is illustrated in FIG. 4A.

Single DSA on 193i Chemical Pre-Pattern

Comparative Examples

A solution of PS-b-PMMA block copolymer (22 k-22 k from polymer source, 25 nm pitch) with 2% w/w solid content in PGMEA was spin-coated on the patterned-neutral material at 3000 rpm for 30 sec and annealed at 255° C. for 2 min to form a first directed self-assembled structure. The process is illustrated in FIG. 4A as "single DSA". Such a DSA structure typically has more defects in the thicker block copolymer films than in the thinner block copolymer films, as shown in FIG. 4B. Using different spin rates, different film thicknesses of PS-b-PMMA were achieved. From top to bottom, a 47 nm thick PS-b-PMMA film is achieved using 3000 rpm, a 55 nm thick PS-b-PMMA is achieved using 2000 rpm, and a 62 nm thick PS-b-PMMA achieved using 1500 rpm. After the first DSA, the thicker films (55 nm thick and 62 nm thick films) have more DSA defects than the thinner films (47 nm thick). Note: All SEM images shown in FIG. 4B were taken after application of a short oxygen reactive ion etch (O2-RIE) process to selectively remove the PMMA domains and increase image contrast during SEM (scanning electron microscopy) characterization.

Double DSA on 193i Chemical Pre-Pattern

Figures 4C, 4D:
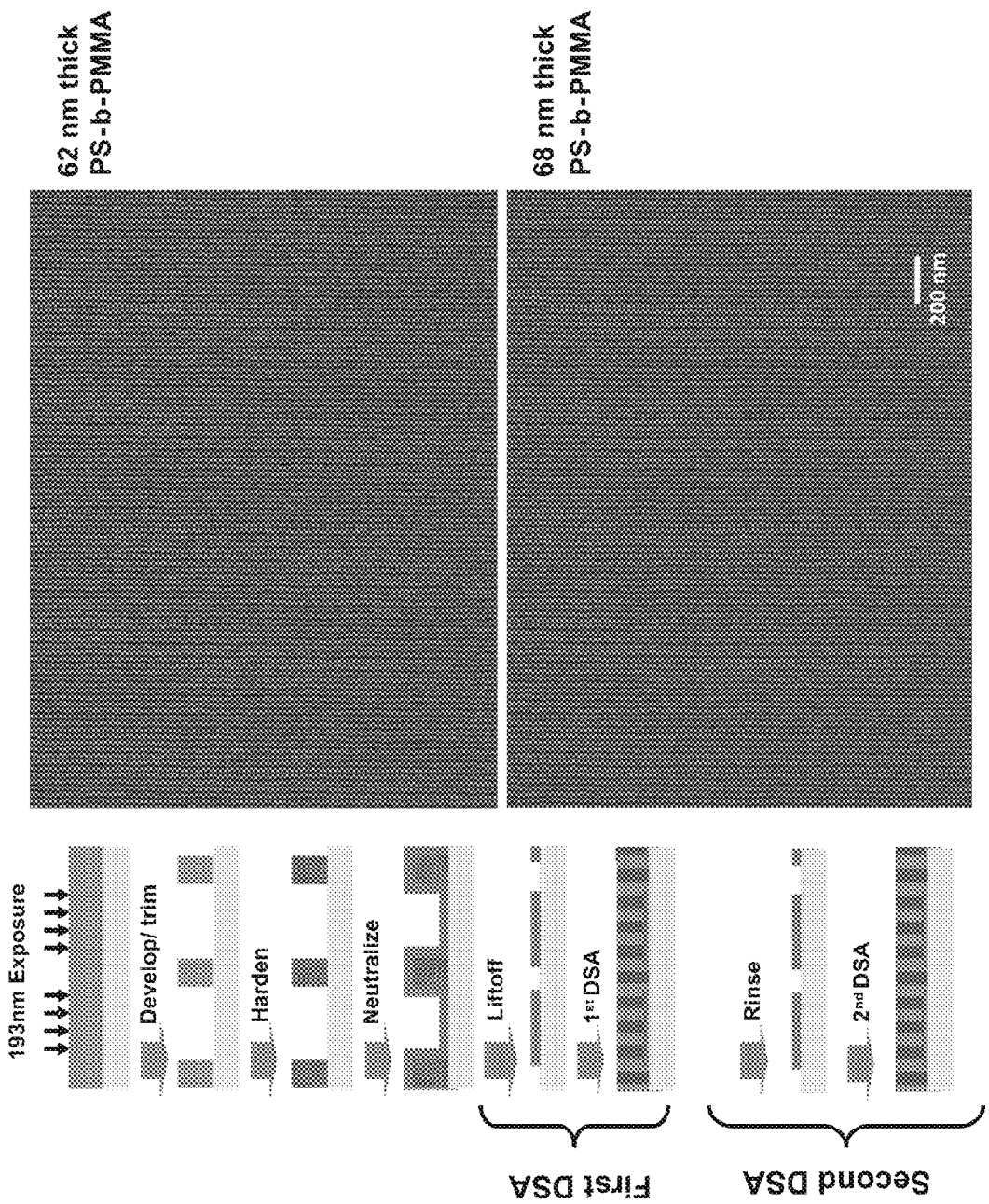
FIG. 4C shows the process flow for the inventive double DSA process.
FIG. 4D shows SEM images of directed self-assembled structures of two different film thicknesses formed by the inventive double DSA process of FIG. 4C. The PMMA domains have been removed by an O2 RIE process to provide contrast for visualization.

The double DSA process is shown in FIG. 4C. After a single DSA process was carried out as described above (using a 55 nm thick PS-b-PMMA film), a solvent rinse was done by casting PGMEA on the first DSA structure for 30 s and spinning the sample dry to remove any solvent and all or substantially all of the DSA structure. Another spin-coating of PS-b-PMMA block copolymer (22 k-22 k, 25 nm pitch) with 2% w/w solid content was then carried out at either 1500 or 1200 rpm for 30 seconds, and the films were annealed at 255° C. for 2 min to generate the second DSA structures having fewer defects than those of the first DSA structures. FIG. 4D shows the results of double DSA using 62 nm thick film (coated at 1500 rpm) and 68 nm film (coated at 1200 rpm). The double DSA process produced second DSA structures comprised of thicker PS-b-PMMA films with significantly fewer defects than those from a single DSA process. Note: All SEM images shown in FIG. 4D were taken after application of a short oxygen reactive ion etch to selectively remove the PMMA domains and increase image contrast during SEM (scanning electron microscopy) characterization.

Example #3

Double DSA on 300 mm Wafers

Preparation of chemical pre-patterns using 193i

Chemical guiding pre-patterns with 100 nm grating-pitch were generated by pattern-wise exposing a stack comprising a 90 nm thick layer of topcoat (JSR TCX-041) on a 70 nm thick positive-tone 193 nm photoresist (JSR AX3538) on a 35 nm thick silicon-containing antireflection coating (Shin Etsu SHB A940) on a 100 nm thick organic planarization layer (Shin Etsu ODL 102) on a 300 mm silicon wafer using ArF immersion lithography (ASML 1950i, 1.35 NA, Dipole 35×, 0.87/0.779 illumination with y-polarization) at Albany Nanotech, performing a post-exposure bake at 110° C. for 60 s, and removing the topcoat and developing the exposed regions with a standard aqueous alkaline developer (0.26N TMAH) in a manner analogous to the method described in Cheng et al. *ACS Nano*, 2010, 4, 4815-4823. A polarity switch/hardening process was carried out by exposing the generated guiding pattern to the output from a 193 nm dry ASML exposure tool with a total flood exposure dose of 60 mJ/cm$^2$, followed by a hard-bake at 115° C./60 s and 200° C./120 s. An orientation control material of formulated poly(styrene-co-methyl methacrylate-co-glycidylmethacrylate) was then spin casted at 2000 rpm on the hardened guiding pattern using a Sokudo RF3 300 mm spin-track and baked at 215° C. for 3 mins. The guiding pattern was brought into contact with a standard aqueous alkaline developer (0.26N TMAH) for 30 s, followed by a DI water rinse to remove the hardened guiding pattern while maintaining the orientation control material on the surface.

Double DSA

Figure 5:
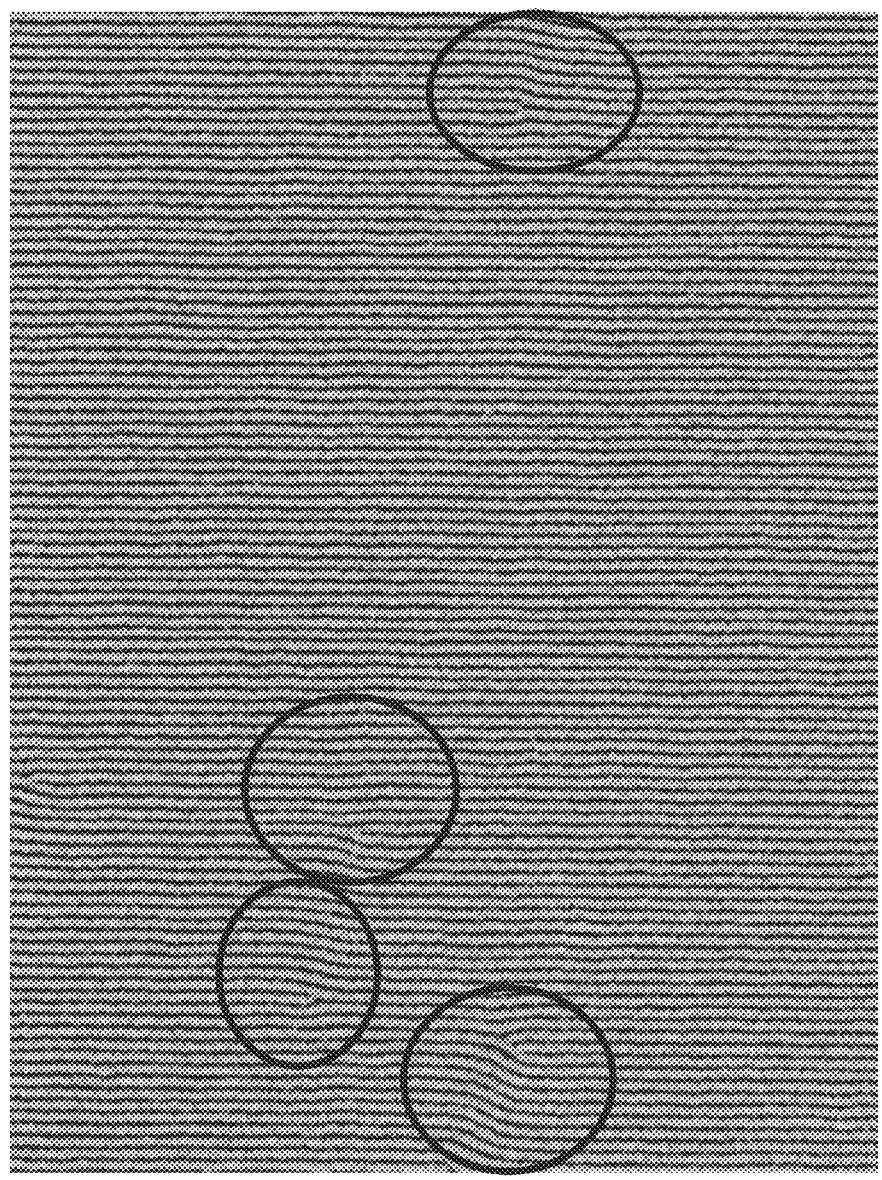
FIG. 5 shows a directed self-assembled structure with common DSA defects highlighted. The PMMA domains have been removed by an O2 RIE process to provide contrast for visualization.

A solution of PS-b-PMMA block copolymer (22 k-22 k, 25 nm pitch) with 2% w/w solid content was spin-coated at 2000 rpm on the patterned-neutral material and annealed at 255° C. for 5 min to form a first directed self-assembled structure. A solvent rinse was done by dynamic rinsing with PGMEA of the first DSA structure on a Sokudo RF3 300 mm spin-track to remove all or substantially all of the first DSA structure, followed by spinning the wafer dry. Another spin-coating of PS-b-PMMA block copolymer (22 k-22 k, 25 nm pitch, 2% w/w solid content in PGMEA) at 1200 rpm and an annealing bake at 250° C. for 3 mins was then carried out to generate the second DSA structure having a thicker block copolymer film and fewer defects than that of the first DSA structure. For both regular and double DSA, an O2 RIE was performed to selectively remove the PMMA blocks in order to achieve better image contrast during SEM (scanning electron microscopy) characterization. For a single DSA process, a preliminary defect inspection indicated that the defect density was 1 dislocation defect per 264 μm$^2$ (~380,000 per cm$^2$); see Bencher et al. *Proc. SPIE* 2011, 7970, 79700E-1-9. In this inspection, only DSA-related defects such as dislocations and disclinations were counted. Other non-DSA defects such as those due to particles were excluded from the analysis. In comparison, the DSA dislocation defect density was measured to be 25 per cm$^2$ (see Bencher et al. *Proc. SPIE* 2011, 7970, 79700E-1-9 and Bencher et al. *Proc. SPIE* 2012, 8323, 83230N-1-10) for a wafer prepared using a double DSA process. Thus, a double DSA process significantly reduces the DSA defectivity. FIG. 5 shows an SEM micrograph of an exemplary DSA structure from a single DSA process with some dislocation defects highlighted.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless stated otherwise.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

The invention claimed is:

1. A method of reducing the number of defects in a directed self-assembled structure formed on a guiding pre-pattern on a substrate, the method comprising:
   (a) applying a first layer comprising a first self-assembly material onto the guiding pre-pattern, the first self-assembly material forming domains whose alignment and orientation are directed by the guiding pre-pattern, thereby creating a first self-assembled structure;
   (b) optionally annealing the first self-assembled structure;
   (c) directly following step (b), or if step (b) is not performed then directly following step (a): washing away the first self-assembled structure, without removing the guiding pre-pattern; and
   (d) after said washing, applying a second layer comprising a second self-assembly material over the substrate, wherein the second layer occupies space previously occupied by the first layer, the second self-assembly material forming a second self-assembled structure having fewer defects than the first self-assembled structure.

2. The method of claim 1, wherein no etch process is performed between (i) the step of applying the first layer and (ii) the step of applying the second layer.

3. The method of claim 1, comprising:
washing away the second self-assembled structure; and
after said washing away of the second self-assembled structure, applying a third layer comprising a third self-assembly material over the substrate, wherein the third layer occupies space previously occupied by the first layer, the third self-assembly material forming a third self-assembled structure having fewer defects than the second self-assembled structure.

4. The method of claim 1, comprising:
annealing the first layer, prior to said washing.

5. The method of claim 1, comprising:
after the step of washing but before the step of applying the second layer, baking the substrate, thereby removing any residual solvent.

6. The method of claim 1, comprising:
annealing the second layer.

7. The method of claim 1, wherein the first self-assembly material and the second self-assembly material are the same kind of material.

8. The method of claim 1, wherein the first material and the second material both include PS-b-PMMA.

9. The method of claim 1, wherein the thickness of the second layer is at least about 55 nm.

10. The method of claim 1, wherein the thickness of the second layer is greater than two times that of a characteristic pitch of the second self-assembled structure.

11. The method of claim 1, wherein the second self-assembled structure has a pitch that is less than 50 nm.

12. The method of claim 1, wherein the second self-assembled structure has a pitch that is no greater than about 25 nm.

13. The method of claim 1, wherein the method of claim 1 is part of an in-line process.

14. The method of claim 13, wherein the in-line process is a 300 mm wafer process.

15. The method of claim 1, wherein the thickness of the first layer is less than the thickness of the second layer.

16. The method of claim 1, wherein the pre-pattern is a chemical pre-pattern.

17. The method of claim 1, comprising etching the second self-assembled structure.

18. The method of claim 1, comprising:
annealing the first layer, prior to said washing; and
annealing the second layer.

19. The method of claim 18, wherein the second self-assembled structure has a pitch that is less than 50 nm.

20. The method of claim 19, comprising etching the second self-assembled structure.

21. The method of claim 1, wherein the second self-assembled structure has fewer dislocation defects than the first self-assembled structure.

22. The method of claim 1, wherein the second self-assembled structure has a dislocation defect density less than or equal to about 25 per square centimeter.

23. A method of reducing the number of defects in a directed self-assembled structure formed on a guiding pre-pattern on a substrate, the method comprising:
(a) applying a first layer comprising a first self-assembly material onto the guiding pre-pattern, the first self-assembly material forming domains whose alignment and orientation are directed by the guiding pre-pattern, thereby creating a first self-assembled structure;
(b) optionally annealing the first self-assembled structure;
(c) directly following step (b), or if step (b) is not performed then directly following step (a): washing away the first self-assembled structure, and leaving behind a modified guiding pre-pattern; and
(d) after said washing, applying a second layer comprising a second self-assembly material onto the modified guiding pre-pattern, the second self-assembly material forming domains whose alignment and orientation are directed by the modified guiding pre-pattern, thereby creating a second self-assembled structure having fewer defects than the first self-assembled structure.

24. The method of claim 23, wherein no etch process is performed between (i) the step of applying the first layer and (ii) the step of applying the second layer.

25. The method of claim 23, comprising:
annealing the first layer, prior to said washing.

26. The method of claim 23, comprising:
annealing the second layer.

27. The method of claim 23, wherein the first material and the second material both include PS-b-PMMA.

28. The method of claim 23, wherein the method of claim 23 is part of an in-line process.

29. The method of claim 28, wherein the in-line process is a 300 mm wafer process.

30. The method of claim 23, wherein the thickness of the first layer is less than the thickness of the second layer.

31. The method of claim 23, wherein the pre-pattern is a chemical pre-pattern.

32. The method of claim 23, comprising etching the second self-assembled structure.

33. The method of claim 23, wherein the second self-assembled structure has fewer dislocation defects than the first self-assembled structure.

34. The method of claim 23, wherein the second self-assembled structure has a dislocation defect density less than or equal to about 25 per square centimeter.

* * * * *